United States Patent [19]

Yim et al.

[11] Patent Number: 5,511,022

[45] Date of Patent: Apr. 23, 1996

[54] DEPLETION MODE NAND STRING ELECTRICALLY ERASABLE PROGRAMMABLE SEMICONDUCTOR MEMORY DEVICE AND METHOD FOR ERASING AND PROGRAMMING THEREOF

[75] Inventors: Hyung-Kyu Yim; Woong-Moo Lee, both of Seoul, Rep. of Korea

[73] Assignee: Samsung Electronics Co., Ltd., Suwon, Rep. of Korea

[21] Appl. No.: 517,197

[22] Filed: Aug. 21, 1995

Related U.S. Application Data

[63] Continuation of Ser. No. 359,686, May 31, 1989, abandoned.

[30] Foreign Application Priority Data

Dec. 15, 1988 [KR] Rep. of Korea .................. 1988-16714

[51] Int. Cl.$^6$ ................................................. G11C 16/06
[52] U.S. Cl. .................... 365/185.17; 365/185.25; 365/185.27; 365/189.05; 365/189.06; 365/195
[58] Field of Search ........................ 365/185.17, 185.25, 365/185.27, 189.05, 189.06, 195

[56] References Cited

U.S. PATENT DOCUMENTS

| | | | |
|---|---|---|---|
| 4,289,982 | 9/1981 | Smith | 365/185.25 |
| 4,513,397 | 4/1985 | Ipri et al. | 357/23.5 |
| 4,580,247 | 4/1986 | Adam | 365/185 |
| 4,612,461 | 9/1986 | Sood | 307/296.2 |
| 4,723,225 | 2/1988 | Kaszubinski et al. | 365/185 |
| 4,758,984 | 7/1988 | Yoshida | 365/104 |
| 4,803,659 | 2/1989 | Hallenbeck | 365/104 |
| 4,852,062 | 7/1989 | Baker et al. | 365/185 |
| 4,939,690 | 7/1990 | Momodomi et al. | 365/185.17 |
| 4,954,991 | 9/1990 | Saeki et al. | 365/185.25 |
| 4,958,324 | 9/1990 | Devin | 365/185.25 |
| 4,959,812 | 9/1990 | Momodomi et al. | 365/185.17 |
| 4,962,481 | 10/1990 | Choi et al. | 365/185.17 |
| 5,050,125 | 9/1991 | Momodomi et al. | 365/185.17 |
| 5,270,969 | 12/1993 | Fwahashi | 365/185.17 |

FOREIGN PATENT DOCUMENTS

| | | | |
|---|---|---|---|
| 297540 | 1/1989 | European Pat. Off. | 365/185 |
| 60-182162 | 9/1985 | Japan | 365/185 |
| 63-266886 | 11/1988 | Japan | 365/185 |
| 64-7397 | 1/1989 | Japan | 365/185 |
| 1-133290 | 5/1989 | Japan | 365/185 |

OTHER PUBLICATIONS

E. Adler, "Densely Arrayed EEPROM Having Low–Voltage Tunnel Write," IBM Tech. Discl. Bull., vol. 27 #6, Nov., 1984, pp. 3302–3307.

R. Stewart et al., "A High Density EPROM Cell And Array," Symp. on VLSI Tech., DIG. Of Tech Papers, May 1986, pp. 89–90.

*Primary Examiner*—Joseph E. Clawson, Jr.
*Attorney, Agent, or Firm*—Robert E. Bushnell

[57] ABSTRACT

A memory string for using in an EEPROM device is provided which has two selection transistors and a plurality of depletion-type floating gate transistors whose drain-source paths are connected in series with each other between two selection transistors. The EEPROM device comprises a memory cell array including a plurality of bit lines arranged in columns and a plurality of memory strings arranged in rows and columns, each of memory strings in the same columns connected between the corresponding bit line and the ground; a row decoder for selecting memory strings in the same row and supplying predetermined voltages to control gates to the floating gate transistors in the selected memory strings according to a program, erase or read operation; a column decoder for coupling the bit lines to a data line according to the operation mode; means for pre-charging unselected bit lines during the program operation to a predetermined voltage so as to prevent erase of unselected floating gate transistors; a program control circuit connected to the data line for supplying a program voltage to the selected bit line during the program operation; and means for grounding all bit lines during the erase operation.

33 Claims, 12 Drawing Sheets

DEPLETION MODE NAND STRING ELECTRICALLY ERASABLE PROGRAMMABLE SEMICONDUCTOR MEMORY DEVICE AND METHOD FOR ERASING AND PROGRAMMING THEREOF

This is a continuation of application Ser. No. 07/359,686, filed on May 31, 1989, for ELECTRICALLY ERASABLE PROGRAMMABLE SEMICONDUCTOR MEMORY DEVICE AND METHOD FOR ERASING AND PROGRAMMING THEREOF, now abandoned.

BACKGROUND OF THE INVENTION

The present invention relates to an electrically erasable programmable read only memory (EEPROM) device and a method for erasing and programming the same and, more particularly, to an EEPROM capable of being erased and programmed without disturbance of unselected memory cells during an erase or program operation and to a method for erasing and programming therefor.

An EEPROM is a read only memory that can be erased and reprogrammed electrically in circuit. There are various technologies for basic memory elements used in the EEPROM, but the most widely used is based on floating gate transistor having floating gate tunnel oxide (FLOTOX) which was developed from the floating gate transistor of ultra-violet erasing type EPROM. The floating gate transistor of FLOTOX EEPROM is the memory element that may be erased and programmed electrically by employing the tunneling of electrons from a drain to a floating gate and from the floating gate to the drain via the tunnel oxide of about 500Å (see U.S. Pat. No. 4,203,158). However, when the FLOTOX-type transistor is actually used in an EEPROM memory cell array, one EEPROM cell, i.e., one bit cell, of the single FLOTOX-type transistor is not sufficient for the proper function of the memory, but a second transistor called a selection transistor is required. If one selection transistor is not used to each EEPROM cell, high voltage applied to one drain appears on drains of other cells in the same bit line (or column) thereby resulting in erase for the unselected cells. We call this the disturbance of cell. Therefore, the requirement of not only two transistors per bit but also additional tunneling area in floating gate transistors results in too large chip area to be applied for high-density FLOTOX EEPROM devices.

To solve such drawback, a flash EEPROM cell, which may use one transistor per bit and instantaneously erase contents of all memory cells, has been developed. The basic structure of such cell is similar to that of a double polysilicon floating gate transistor of the prior art EPROM. But, the significant difference between the both is that edges of the source or drain region and the floating gate are overlapped via a thin gate oxide. The memory cell array employing the EEPROM cell of such structure is disclosed in U.S. Pat. No. 4,698,787. The memory cell of this patent is erased by Fowler-Nordheim (F-N) tunneling of electrons via the overlapped area from the floating gate to the source region, and is programmed by hot electron injection from a channel region to the floating gate. In the memory cell array of this patent, control gates of cells in the respective rows are connected to the respective corresponding word lines (or X lines), drains of the cells in the respective columns are connected to the respective corresponding bit lines (or Y lines) and sources of the cells are in common connected to a single common source line. In this memory cell array, since the erase operation of cells is achieved by applying high voltages to the common source line and grounding all word lines, there is a limitation that all of the cells in the same chip are erased at a time. Also, since the programming of the cells is achieved by applying high voltages to the drain of the cell in order to generate the hot electrons, it is necessary to flow large drain current. Therefore, a high voltage supply source having a large current capacity is required for programming the cell from the chip outside.

Other prior art of the flash EEPROM is an EEPROM cell having a NAND structure which is disclosed in 1988 SYMPOSIUM ON VLSI CIRCUITS, DIGEST OF TECHNICAL PAPERS, at pages 33 to 34. Referring to FIG. 1 in connection with the technology disclosed in this paper, it is illustrating an equivalent circuit diagram of a flash EEPROM memory cell array 10 in which a plurality of memory strings MS11 to MS22 connected between each of bit lines (or column lines) BL1 and BL2 and the ground are arrayed in rows and columns. Each of the memory strings (or NAND cells) is that drain-source paths of a string selection transistor ST, memory cells MC1 to MC8 of 8-bits and a ground selection transistor GT are connected in series. A string selection line SSLk, word lines WLk1 to WLk8 and a ground selection line GSLk are respectively connected to gates of selection transistors ST in memory strings MSk1 to MSk1 in the k-th row, control gates of memory cells MC1 to MC8 and the gate of ground selection transistors GT ("k" stands for a positive integer number).

Each of the memory cells MC1 to MC8 has the same structure with each other. The structure is fabricated by the known double polysilicon gate technology equal to that of the above-mentioned flash EEPROM cell. The edge of the floating gate overlaps the edge of the drain with the gate oxide of 100Å interposed therebetween. The floating gate and the control gate are respectively formed by first and second polysilicon layers. The oxide thickness between the floating gate and the control gate is about 250Å.

Discussion will be made about erase program and read operations in reference with the disclosure of the paper.

The erase operation of the respective memory cells may be achieved by F-N tunneling of electrons from channels to floating gates. For example, erase of whole memory cells MC1 to MC8 in memory strings MS11 and MS12 in the first row may be achieved by applying 13 volts to word lines WL11 to WL18 and also applying zero volt to all bit lines BL1 and BL2, after turning ON string selection transistors ST and ground selection transistors GT by applying 5 volts to the string selection line SSL1 and the ground selection line GSL1. Therefore, each of memory cells MC1 to MC8 in memory strings MS11 and MS12 is erased to an enhancement transistor having a positive threshold voltage (Vte=0.5 to 2 volts) by absorbing electrons into the floating gate.

On the other hand, program operation may be performed per each selected bit by tunneling of electrons from the floating gate to the drain. For example, for selectively programming a memory cell MC4 in the memory string MS11, after causing to respectively turn on and off the string selection transistor ST and the ground selection transistor GT by respectively applying 20 volts and the ground on the string selection line SSL1 and the ground selection line GSL, there is applied 20 volts on unselected word lines WL11 to WL13 between the selected bit line BL1 and the selected word line WL14 and also applied the ground on the selected word line WL14 and unselected word lines WL15 to WL18. Therefore, high voltages on the bit line BL1 transfer to the drain of the selected memory cell MC4 via unselected memory cells MC1 to MC3 in the memory string MS11, and then electrons in the floating gate flow out into the drain of MC4 via the overlapped region, due to the voltage difference between the drain and the floating gate of MC4. As a result, the memory cell MC4 is programmed into a depletion transistor having a negative threshold voltage (Vtp=−2 to −5 volts).

The read operation of the memory cell MC4 in the memory string MS11 may be achieved by grounding the word line WL14 and applying the power supply voltage Vcc (=5 volts) on the string and ground selection lines SSL1 and GSL1 and the unselected word lines WL11 to WL13 and WL15 to WL18. If the memory cell MC4 has already been programmed, current will flow on the bit line BL1 because of the conduction of the memory cell MC4. However, if the memory cell MC4 were an erased cell, current will not flow on the bit line BL1 by the nonconduction of the memory cell MC4. Therefore, a sense amplifier may read by sensing the current on the bit line BL1.

Since the memory string as mentioned above is connected through one contact hole on the bit line and includes two selection transistors per 8-bits, it may be applied to high-density memory devices. Moreover, since the memory string may be erased and programmed by F-N tunneling of electrons, the current dissipation is very low during its operation. Therefore, it has an advantage of being able to use on-chip high-voltage pulse generator required for erasing and programming employing a single power supply (5 volt power supply).

However, the NAND cell has problems as follows.

The first problem is the disturbance of unselected memory cell arising during the program operation. For example, we will assume that the memory cell MC4 in the memory string MS11 is being programmed. Word lines WL11 to WL13 are applied by the pass voltage (20 volts) higher than the erase voltage (13 volts) required for erase in order to transfer the program voltage (20 volts) applied on the bit line BL1 to the drain of memory cell MC4. Therefore, programmed memory cells on other bit lines connected to word lines WL11 to WL13, i.e., memory cells MC1 to MC3 in the memory string MS12, may be erased automatically. Therefore, it is impossible to erase and program each word line of the memory array and it has a limitation that the program should be sequentially performed from the lowermost cell to the uppermost cell.

The second problem is the over-erase of memory cells, i.e., the increasing of the threshold voltage of erased cells. During the program operation, since the pass voltage (20 volts) even higher than the erase voltage (13 volts) is applied to word lines above the selected word line (hereinbelow referred to as "pass word lines"), for example, word lines WL11 to WL13 where MC4 in the memory string MS11 is selected, the over-erase of memory cells arises at unselected memory cells on the pass word lines. According to repetition of erase and program, even when the high erase voltage are continuously applied to memory cells programmed into erased states, the over-erase arises. Therefore, the existance of any one cell over-erased in a memory string makes slow the reading speed of programmed cell in the memory string or, in the worst case, causes a reading error.

The third problem is the disturbance of cells due to the over-program. During the program operation, since the word line of memory cell coupled just below the selected memory cell is grounded, if the selected memory cell were over-programmed, high program voltage (20 volts) is transferred to the drain of the next memory cell via the drain-source path of the selected memory cell, thereby causing the next memory cell to be programmed undesirably.

SUMMARY OF THE INVENTION

An object of the present invention is to provide a NAND cell array and its peripheral circuit capable of performing erase and program by each word line in a high-density nonvolatile memory device.

Another object of the present invention is to provide a high-density NAND-type EEPROM device having high reliability without the disturbance of cells during a program or erase operation.

Further object of the present invention is to provide an EEPROM device capable of preventing from over-erase and over-program during a repetitive program and erase operation and to provide method of erasing and programming therein.

Still further object of the present invention is to provide an EEPROM device capable of reducing the cell size thereof without the burden of insulation, by employing a low program voltage.

To accomplish the object, an electrically erasable programmable semiconductor memory device comprises:

a memory cell array including a plurality of bit lines arranged in columns and a plurality of memory strings arranged in rows and columns, each of memory strings including first and second transistors each having a gate, a drain and a source and a plurality of floating depletion-type gate transistors each having a control gate, a floating gate, a source and a drain, each of the memory strings in the respective same column connected between the corresponding bit line and a reference potential, drain-source paths of the first transistor, the floating gate transistors and the second transistor in each of the memory strings connected in series with each other between the corresponding bit line and the reference potential, the memory cell array including a string selection line connected to gates of first transistors in each of memory strings in the same row, a plurality of word lines connected to control gates of the floating gate transistors in each of the memory strings in the same row and a ground selection line connected to gates of second transistors in each of memory strings in the same row;

a row decoder for selecting memory strings in the same row and supplying predetermined voltages to the string and ground selection lines and word lines connected to the selected memory strings according to a erase, program or read operation;

a column decoder for coupling the bit lines to a data line according to the operation mode;

means for precharging the unselected bit lines during the program operation so as to prevent erase of unselected floating gate transistors;

a program control circuit connected to the data line for supplying a program voltage to the selected bit line during the program operation;

means for grounding all bit lines during the erase operation; and a back-bias generator for supplying a back-bias voltage during the read operation to a well region in which the memory cell array is formed.

Another embodiment of the present invention provides a latch circuit for sensing memory states of memory cells and precharging the respective bit lines to a predetermined voltage according to erased states of the selected memory cells in order to prevent over-erase.

BRIEF DESCRIPTION OF THE DRAWINGS

Other objects and advantages of the present invention will become apparent from the following detailed description when taken in conjunction with the accompanying drawings in which.

DETAILED DESCRIPTION OF THE PREFERRED EMBODIMENTS

Figure 1:
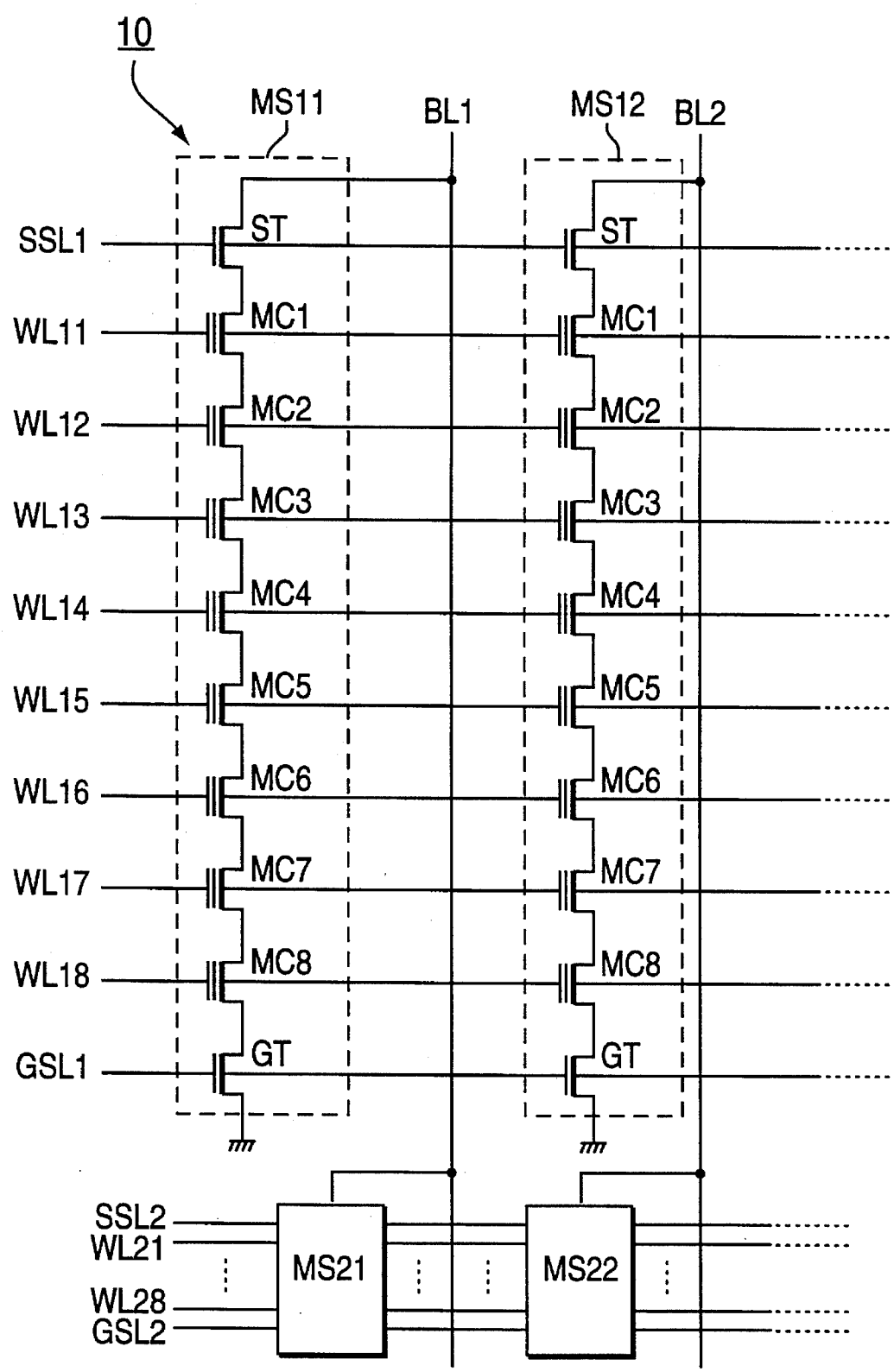
FIG. 1 is an equivalent circuit diagram of an EEPROM cell having a prior art NAND structure.
Figure 2A:
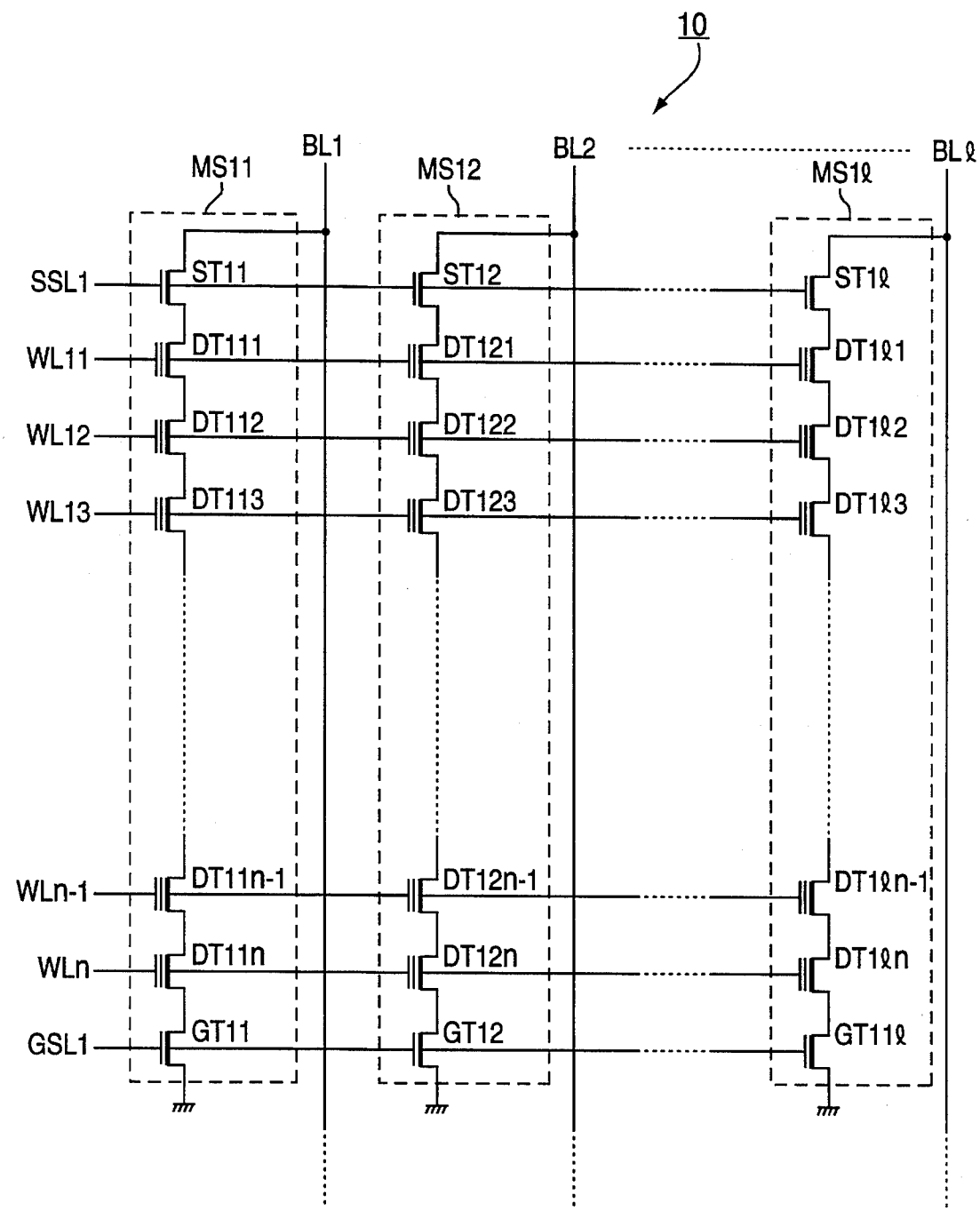
FIG. 2A is an equivalent circuit diagram of a portion of an EEPROM memory cell array according to the present invention.

Referring to FIG. 2A, an EEPROM memory cell array is illustrated according to the present invention. In the drawing, the same symbols as those in the FIG. 1 represent the same parts or elements as those in FIG. 1. The arrangement of memory strings in the EEPROM memory array 10 is the same arrangement as that of the prior art in FIG. 1. FIG. 2A is illustrating only memory strings MS11 to MS1l in the upper most row which are connected to bit lines BL1 to BLl arrayed in l columns. It should be noticed that a memory strings connected to the respective bit lines BL1 to BLl are arranged in a rows. Generally speaking, a memory string MSkw in the k-th row and the w-th column is constructed with a string selection transistor STkw of N-channel MOS FET, n memory cells DTkw1 to DTkwn respectively made of floating gate MOS transistors of depletion type and a ground selection transistor GTkw of N-channel MOS FET. The drain and the source of the string selection transistors STkw are respectively connected to the bit line BLw of metal or polysilicon via contact hole and the drain region of the memory cell DTkw1. The drain-source paths of memory cells DTkw1 to DTkwn are connected in series and the source of the memory cell DTkwn in the last bit is connected to the drain of the ground selection transistor GTkw whose source is grounded. The number n of memory cells, i.e., bit, should be $2^k$. However, in consideration of channel resistance of the respective memory cells, the preferred bit number per memory string is eight. Gates of string selection transistors STk1 to STkl, control gates of memory cells DTk11 to DTkln to DTkln and gates of ground selection transistors GTk1 to GTkl in memory strings MSk1 to MSkl in the k-th row are respectively connected to a string selection line SSLk, word lines WLK1 to WLKn and a ground selection line GSlk.

Figure 2B:
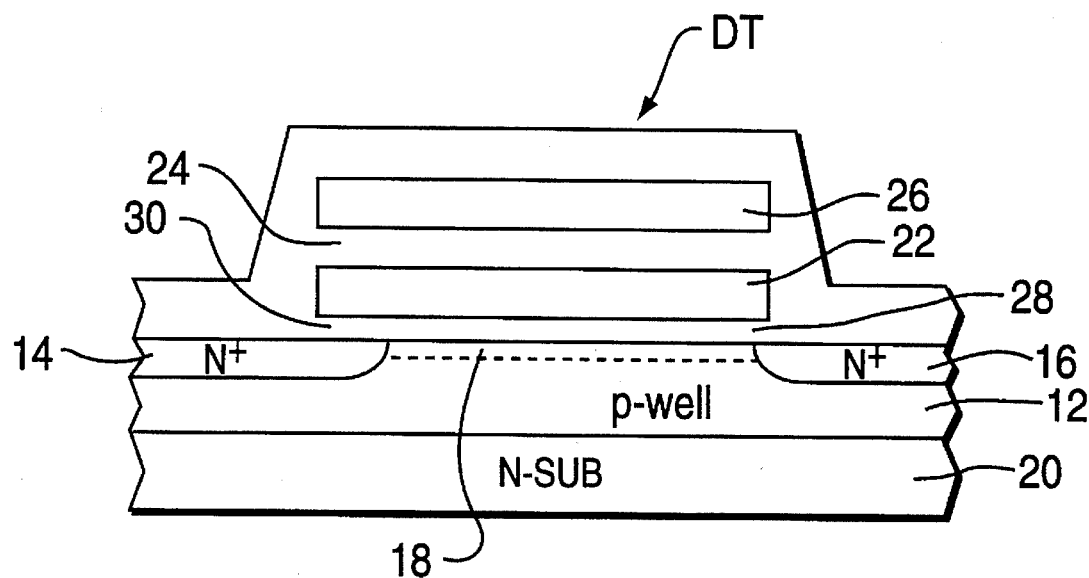
FIG. 2B is a cross-sectional view of a memory cell using in FIG. 2A.

Referring to FIG. 2B, a cross-sectional view of the memory cell in the respective memory strings is illustrated. The structure of the memory cell DT has a drain region 14 and a source region 16 which are spaced apart by a channel region 18 on the surface of a p-well region 12 formed on a N-type semiconductor substrate 20. A floating gate 22 formed by first polysilicon is spaced apart by a gate oxide layer 28 of about 100Å on the channel region 18. One edge portion of the floating gate 22 overlaps one edge portion of the drain region 14 via an oxide layer (overlap region 30) having uniform thickness with the gate oxide layer 28. An intermediate oxide layer 24 of about 280Å is formed on the floating gate 22 and a control gate 26 of second polysilicon is formed on the intermediate oxide layer 24. The channel region 18 is the region implanted by n-type impurities, such as arsenic or phosphorus, prior to the formation oft he floating gate 22. Therefore, the memory cell DT operates as a floating gate MOS transistor of depletion type having a virgin threshold voltage (Vto) of about −3 volts. The memory cell array 10 is fabricated in the p-well region 12 to which a negative back-bias voltage is applied only during a read operation according to the present invention in order to prevent the leakage current flowing via channel regions of erased memory cells.

According to the present invention, erase, program and read operations of the memory cell array 10 will be discussed in reference with the equivalent circuit diagram as shown in FIG. 2A.

Erase of memory cells performed prior to programming may be performed for either whole cells or cells on selected word line. Erasing electrically a memory cell is writing a binary data "1" into the cell. Initially, all of the memory cells remain at completely eliminated states, i.e., programmed states, of electron changes from the floating gates thereof. In this case, to erase all memory cells, all bit lines BL1 to BLl and ground selection lines GSL1 to GSLm, are grounded and all of string selection lines SSL1 to SSLm are applied by power supply voltage of Vcc (5 volts) in order to conduct string selection transistors. At the same time, the erase pulse Ve of 19 volts is instantaneously applied to all of the word lines. At this condition, erase of the respective memory cells may be achieved by F-N tunneling of electrons from the channel 18 to the floating gate 22. The erased memory cells are enhancement MOS transistors having erased threshold voltage Vte of about 1 volt.

Explanation will be made about erase (page erage) of memory cells on one row. For convenience of explanation, it will be described with reference to erase operation of memory cells DT113–DT1l3 on the word line WL13 of FIG. 2A. Such erasing operation may be achieved by grounding all bit lines BL1 to BLl after applying the erase pulse Ve of 19 volts to the selected word line WL13 and supplying the power supply voltage of 5 volts to all unselected word lines WL11, WL12 and WL14 to WL1n and the string selection line SSL1, thereby being able to perform a page erasing operation which erases all memory cells DT113 to DT1l3 disposed at the selected word line WL13.

Next, explanation will be made about programming memory cell DT113 in the memory string MS11. Programming a memory cell is writing a depletion state of the cell, i.e., binary data "0", into the cell. Such program is to apply the ground potential to the selected word line WL13 and the ground selection line GSL1, to apply the power supply voltage Vcc to word lines WL14 to WLn between the selected word line WL13 and the ground selection line GSL1, to apply the pass pulse voltage of 15 volts to word lines WL11 and WL12 between the string selection line SSL1 and the selected word line WL13, to apply a program pulse Vpgm of 13 volts to the selected bit line BL1, and to apply an erase preventing voltage Vei to unselected bit lines BL2 to BLl. Therefore, since the program voltage Vpgm is transferred to the drain of the memory cell DT113 in the memory string MS11 via drain-source paths of the string selection transistor ST and memory cells DT111 and DT112, the memory cell DT113 is programmed into a depletion MOS transistor having a program threshold voltage Vtp of about –4 volts by F-N tunnelling of electrons from the floating gate to the drain thereof.

The application of the power supply voltage Vcc to word lines WL14 to WLn below the selected word line WL13 is to avoid an undesirable program of the memory cell DT114 just below the selected memory cell DT113 which may arise by the over-program of the cell DT113. This is the reason why the electric field between the drain and the floating gate of the memory cell DT114 is sufficiently reduced by the program pulse Vpgm transferred to the drain of the cell DT114 due to the over-program of the cell DT113, and the power supply voltage Vcc applied to the gate of the cell DT114. The application of the erase preventing voltage Vei to unselected bit lines BL2 to BLl is to prevent an undesirable erase of memory cells DT121 to DT1l1 and DT122 to DT1l2 connected with word lines WL11 and WL12, to which the pass voltage Vp is applied. Since the erase preventing voltage Vei is transferred to the respective drains of the memory cells DT121 to DT1l1 and DT122 to DT1l2, F-N tunneling of electrons from the floating gate to the drain may not arise. Therefore, the program thereof may not be achieved.

After the completion of the above-mentioned program, to read the memory cell DT113 in the memory string MS11, the power supply voltage is applied to the string selection line SSL1, unselected word lines WL11, WL12 and WL14 to WLn and the ground selection line GSL1 and the ground voltage is applied to the selected word line WL13. At the same time, a reading voltage of about 2 volts from the sense amplifier is applied to the bit line BL1 and the back-bias voltage of –3 volts is applied to the p-well region in which the memory array 10 is formed as mentioned above. Therefore, since the memory cell DT113 operates as a MOS transistor of depletion mode, the cell DT113 renders to conduction. At the same line, the string selection transistor ST11, memory cells DT111, DT112 and DT114 to DT11n and the ground selection transistor GT11 in the memory string MS11 are at ON states with the application of the power supply voltage Vcc to gates or control gates thereof. Therefore, data in the selected memory cell DT113 may be read by sensing the current state of the bit line BL1 due to the current flowing from the bit line BL1 to the memory string MS11 via the sense amplifier connected to the bit line BL1. If the memory cell DT113 were an erased cell, in the read operation as mentioned above, the memory cell DT113 is at OFF state. At the reading time, the reason why the back-bias voltage of about –3 volts is applied to the p-well region 12 is to completely cut off the current flowing via cell remaining at OFF state. As will be discussed below, the more doped the channel region 12 is with n-type impurities, the more decreases the disturbance of cells. However, the cell held at OFF state which has much doped channel region, may raise a reading error due to the leakage current at the time of reading. Such reading error may remarkably be reduced by the application of the back-bias voltage to the p-well region 12.

It should be noted that the disturbance, i.e., the undesirable erase operation, of cells unselected by the pass pulse in a program operation, may be prevented by fabrication of the memory cells to floating gate MOS transistors of depletion type having negative virgin threshold voltage Vto, and by precharging of unselected bit lines to the erase preventing voltage Vei. The reason will be explained in detail in reference with an equivalent circuit diagram of a memory cell, illustrated in FIG. 3.

Figure 3:
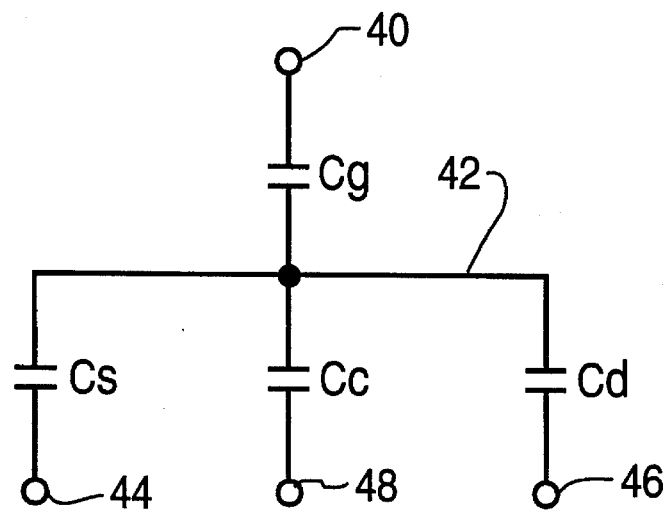
FIG. 3 is an equivalent circuit diagram of the memory cell.

Referring to FIG. 3, the coupling capacitance between the control gate 40 and the floating gate 42 is represented by Cg. The coupling capacitance between floating gate 42, source 44, drain 46 and channel 48 are respectively represented by Cs, Cd and Cc. Now, during a program operation, discussion will be made about one memory cell on an unselected bit line to which the pass pulse Vp is applied. The memory cell conducts with application of the pass voltage Vp to the control gate 40. Since the erase preventing voltage Vei is applied to the source 44, the channel 48 and the drain 46, the floating gate voltage Vfg of the memory cell with regard to the ground potential will be represented by the following equation (1):

$$Vfg = rg \cdot Vp + (1-rg) \cdot Vei - rg \cdot (Vt - Vto) \qquad (1)$$

wherein the coupling ratio $$rg = \frac{Cg}{Cg + Cs + Cc + C_D}$$

and Vt is threshold voltage when the memory cell was erased or programmed. Therefore, the voltage Vgox applied to the gate oxide of the memory cell will be represented by the following equation (2):

$$Vgox = Vfg - Vei = rg \cdot (Vp - Vt) - rg \cdot (Vei - Vto) \qquad (2)$$

As may be seen in the equation (2), undesirable erase of the memory cell with the pass pulse voltage Vp is the worst case when the memory cell was at the programmed state (Vt=Vtp=–4 volts). Also, the lower become the pass voltage Vp and the virgin threshold voltage Vto, and also the higher becomes the erase preventing voltage Vei, then the lower becomes the voltage Vgox. Therefore, it may be easily understood from the equation (2) that the undesirable erase of the nonselected cell will be prevented. However, since setting the erase preventing voltage Vei to too high value has a danger of causing cells on the unselected columns located at the selected row to be programmed, the choice of an appropriate value is preferable.

To make the virgin threshold voltage Vto negative not only prevents undesirable erase at a constant pass voltage Vp but also makes low the pass voltage Vp itself required for program. As may be seen in the equation (1), at a constant Vt, the lower is Vto, the lower is the floating gate voltage Vfg. During a program operation, the voltage applied to the gate oxide layer of the selected memory cell is (Vpgm–Vfg). Therefore, if Vfg is low, it is possible that the memory cell is programmed in a low program voltage Vpgm. The pass pulse voltage Vp required to transfer such program voltage Vpgm to the drain of the selected cell is (Vpgm+Vt). Therefore, if the program pulse voltage Vpgm is low, the voltage Vp also may be set low. Moreover, since making negative the virgin threshold voltage is to lower the body effect of the cell, it is of great help to transferring the program voltage Vpgm to the drain of the selected cell in a low pass voltage. Therefore, since the EEPROM device of the present invention employs a program voltage and a pass voltage lower than that of the prior art, the burden of insulation between cells may be reduced, by which the chip size may be reduced easily.

Figure 4:
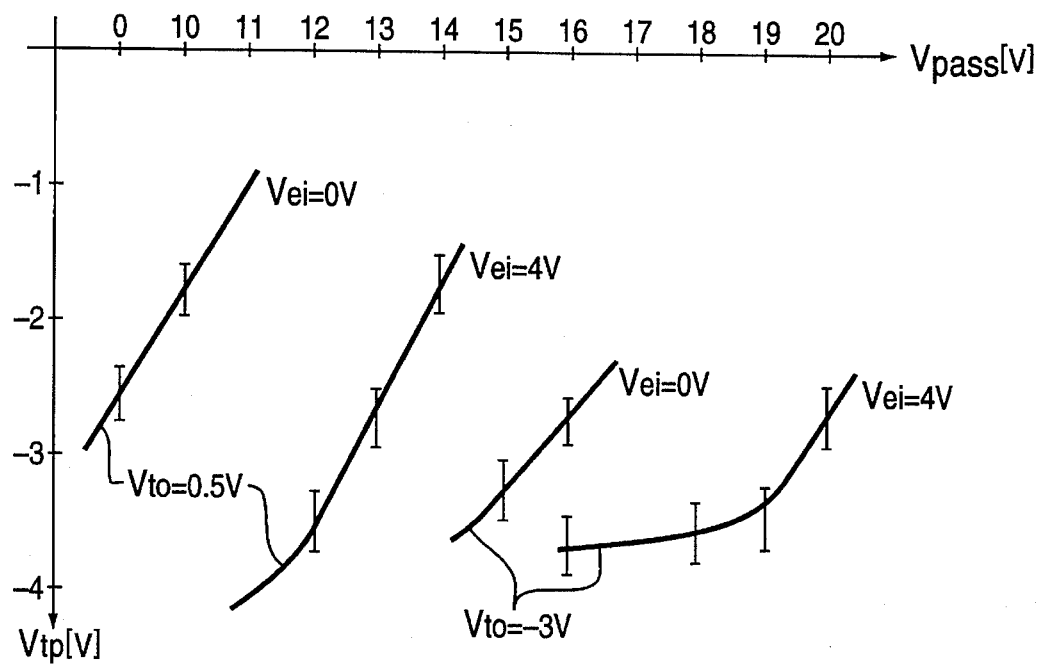
FIG. 4 is a graph for showing the result of preventing from the disturbance arisen by pass voltage according to the present invention.
Figure 5:
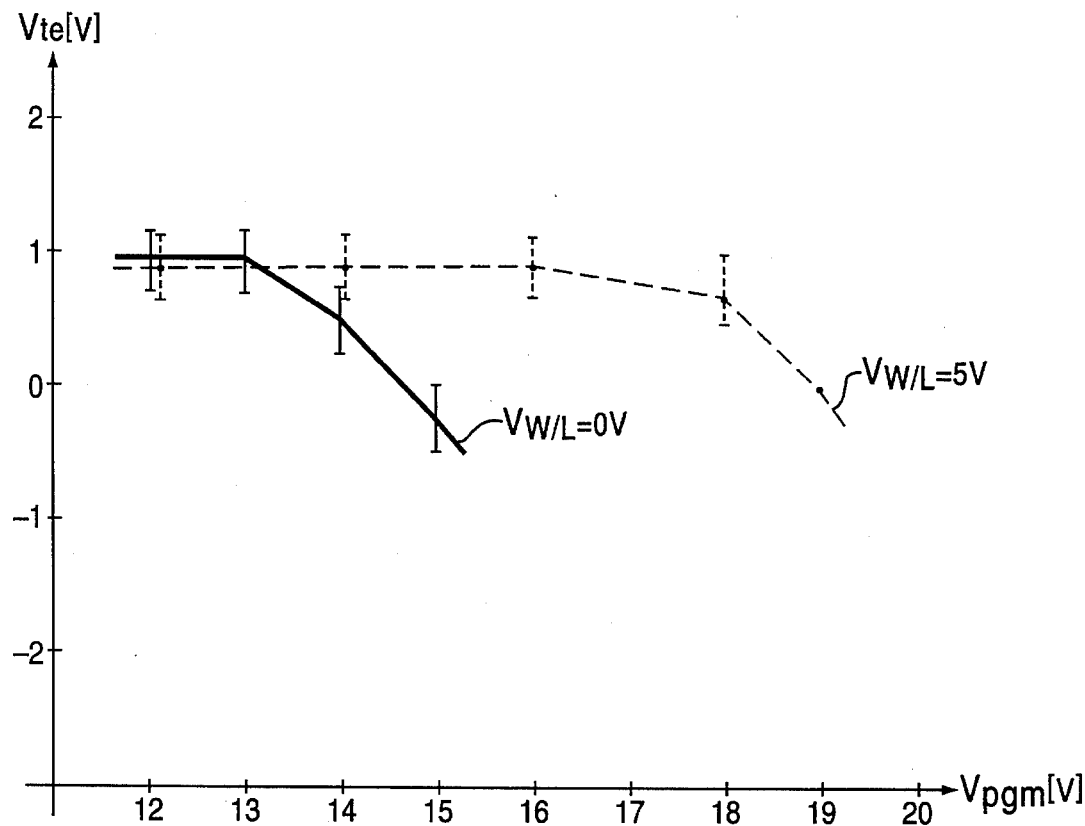
FIG. 5 is a graph for showing the result of preventing from the disturbance arisen by over-program according to the present invention.
Figure 6:
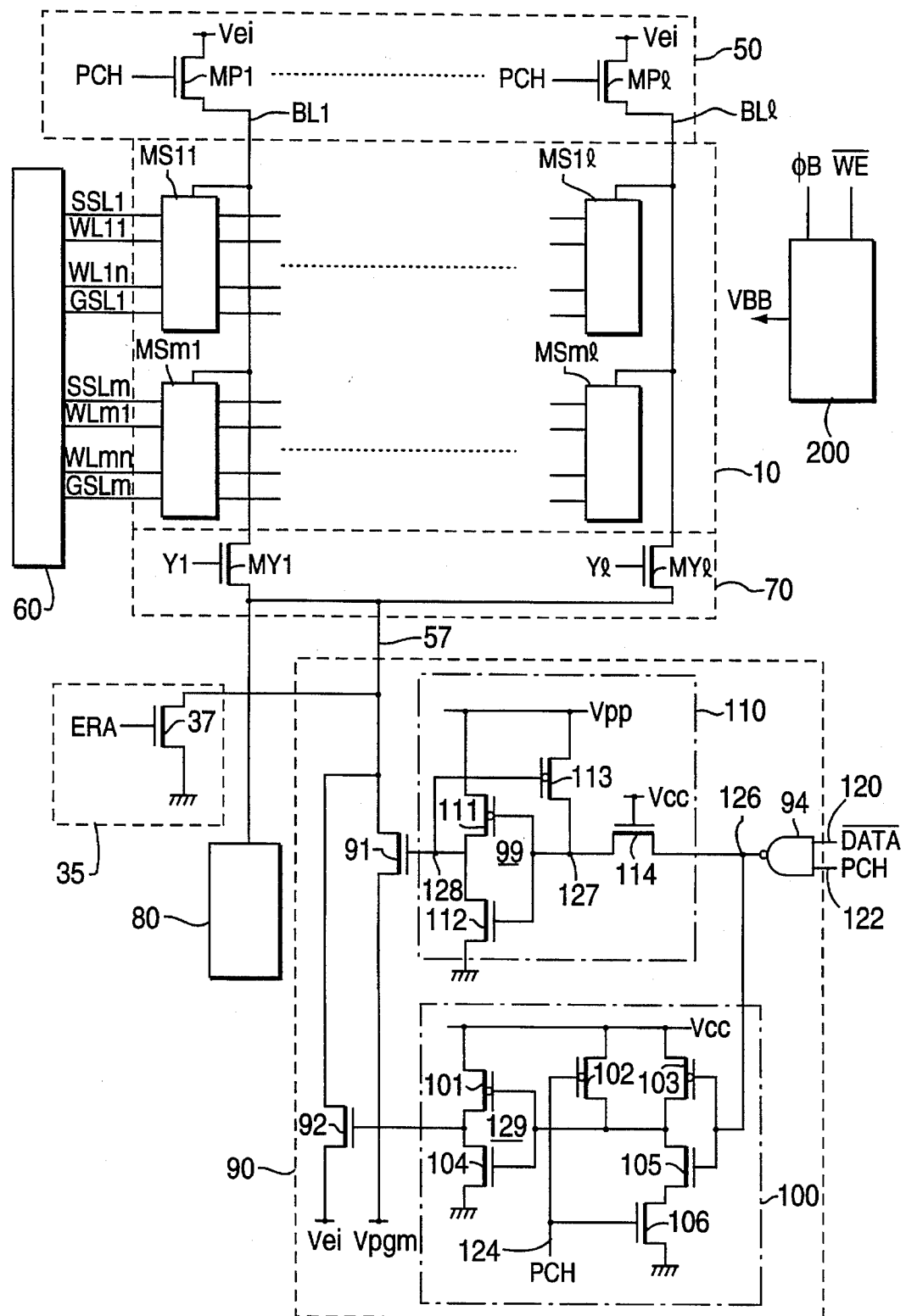
FIG. 6 is a schematic circuit diagram according to the present invention.

Referring to FIG. 4 to FIG. 6, various measuring results are illustrated according to manufacturing of a cell occupying 2.4 μm×3.1 μm in about 1.2 μm design rule whose coupling ratio (rg) is 0.6. FIG. 4 is showing the result of measuring the threshold voltage Vpt, varying the pass pulse voltage from 9 volts to 20 volts, after manufacturing memory cells respectively having the virgin threshold voltages Vto of 0.5 volts and −3 volts and then programming both cells into the threshold voltage of about −3.5 volts. The pulse width of the employed pass pulse voltage Vp is 100-msec and the erase preventing voltage Vei of zero volt and 4 volts is used. As will be seen in FIG. 4, the value of the pass pulse Vp of the memory cell having the virgin threshold voltage of −3 volts increases by about 6 volts, in the range of usable threshold voltage for the same erase preventing voltage, more than that of the memory cell having the virgin threshold voltage of 0.5 volt. Also, the value of Vp, in case of the memory cell having the erase preventing voltage Vei of 4 volts, increases by about 4 volts more than that in case of the memory cell having Vei of zero volt. Therefore, the memory cell having the virgin threshold voltage of −3 volt may be sufficiently programmed without the disturbance of unselected cell employing the pass pulse voltage Vp up to 19 volts, when the erase preventing voltage Vei of 4 volts is applied to the cell. The effect of preventing the disturbance of the unselected cell due to the over-program by applying 5 volts to word lines below the selected word line is illustrated in FIG. 5.

FIG. 5 is illustrating a measured result showing the variation of the threshold voltage Vte of an erased memory cell just below the selected memory cell, with regard to the program pulse voltage Vpgm, when zero volt and power supply voltage (5 volts) are respectively applied to the word lines of unselected memory cells below the selected memory cell which is over-programmed during a program in the memory cell array of the present invention. As will be seen in FIG. 5, the program pulse voltage Vpgm applied to the selected bit line may be allowed up to 18 volts without the disturbance of cells due to the over-program, when 5 volts is applied to the word line of the unselected cell below the selected cell.

FIG. 6 is showing a circuit diagram of an EEPROM device according to the present invention. Referring to FIG. 6, a memory cell array 10 is like to that of FIG. 2A. A row decoder 60 selects memory strings in one row according to input row address signals and provides control signals to the string selection line, the ground selection line and word lines which are connected to the selected memory strings. A column decoder 70 comprises n-channel MOS transistors MY1 to MYl whose drain-source paths are connected between each of bit lines BL1 to BLl and a data line 57 for coupling the data line with the bit line selected according to column selection signals Y1 to Yl which are controlled by column address signals and whose gates are respectively connected to the column selection signals Y1 to Yl.

A precharge circuit 50 comprises n-channel MOS transistors MP1 to MPl whose sources are respectively connected to bit lines BL1 to BLl, whose drains are connected to the erase preventing pulse voltage Vei and whose gates are connected to a precharge signal PCH for precharging the erase preventing voltage Vei to the bit liens BL1 to BLl in response to the precharge signal PCH during the program operation. A sense amplifier 80 is connected to the data line 57 for sensing data of the selected cell according to the current condition of the bit line selected by the column decoder 70 during the read operation. However, the sense amplifier 80 is a known circuit floating in a read or program operation.

A program control circuit 90 is connected to the data line 57 for transferring the program voltage Vpgm to the selected bit line in response to the input data during a program. The program control circuit 90 becomes a floating state to the data line 57 during an erase operation. The program control circuit 90 comprises a NAND gate 94 receiving input data and the precharge signal PCH, an AND gate 100 receiving the output logic signal and the precharge signal PCH, a high voltage switching circuit 110 connected to the output of the NAND gate 94, a n-channel MOS transistor 91 for supplying the program voltage Vpgm to the data line 57 in response to the output signal of the high voltage switching circuit 110, and a n-channel MOS transistor 92 for supplying the erase preventing voltage Vei to the data line 57 in response to the output signal of the AND gate 100. The high voltage switching circuit 110 comprises an inverter 99 which is composed of p-channel MOS transistors 111 and 113, and a n-channel transfer MOS transistor 114. When the input node 126 of the high voltage switching circuit 110 becomes a low level (ground), the output node 128 goes to a voltage Vpp higher than the program voltage Vpgm. But, if the input node 126 is at a logic high level (5 volts), the output node 128 is at the ground potential. It requires that the voltage Vpp be voltages higher than the sum of the program voltage Vpgm and the threshold voltage of the transistors 91 for transferring the program voltage Vpgm. The transfer transistor 114 is located for isolating between the inverter 99 and the NAND gate 94. The AND gate 100 is composed of p-channel MOS transistors 101 to 103 and n-channel MOS transistors 104 to 106. The output node 129 of the AND gate 100 goes to the power supply voltage Vcc so that the transistor 92 transfers the erase preventing voltage Vei to the data line 57, when only the output node 126 of the NAND gate 94 and the precharge signal PCH on the terminal 124 are all logic high level. Therefore, if input data from the input terminal 120 is a logic low level, the program control circuit 90 transfers the program voltage Vpgm to the data line 57 during a program (at this time, PCH="1"). But, when input data of the input terminal 120 is a logic high level (5 volts), the circuit 90 transfers the erase preventing voltage Vei to the line 57.

A bit line grounding circuit 35 comprises a n-channel MOS transistors 37 whose drain-source path is connected between the line 57 and the ground and whose gate is coupled to an erase signal ERA going to a logic high level only during an erase operation. A back-bias generator 200 generates negative back-bias voltage VBB in response to both a write enable signal $\overline{WE}$ going to a logic high level upon operation of a read and a clock signal φB from an oscillator (not shown in the figure). The back-bias voltage VBB is selectively applied to the p-well region of the memory array 10 as discussed above.

Figure 7:
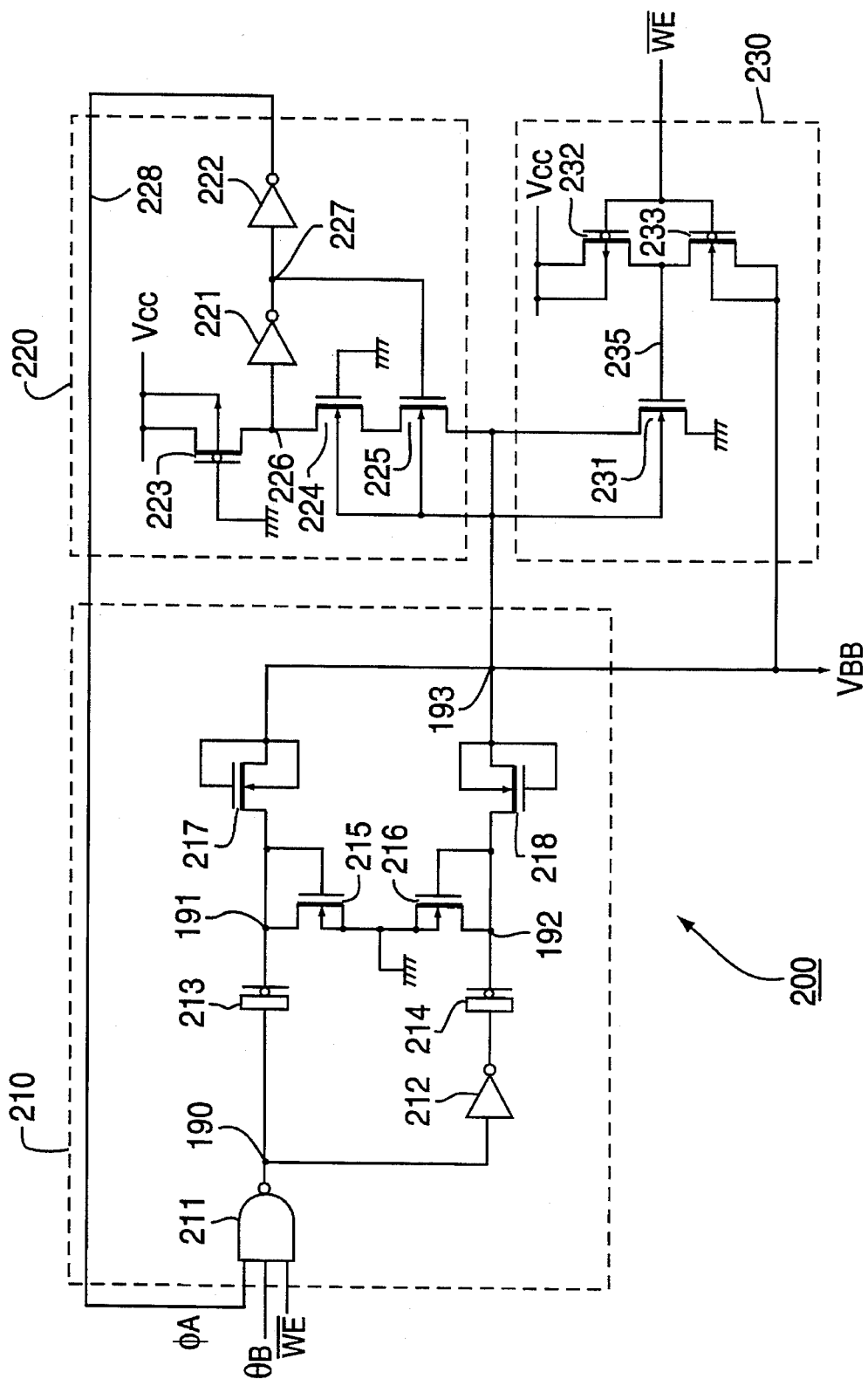
FIG. 7 is a schematic circuit diagram of a back-bias generator applicable in the present invention.

Referring to FIG. 7, a schematic circuit diagram of the back-bias generator is illustrated. The back-bias generator 200 comprises a back-bias discharge circuit 230 for preventing the generation of back-bias upon operations of erase and program, a charge pump circuit 210 for producing the back-bias voltage during a read operation, and a back-bias control circuit 220 for controlling the back-bias voltage constantly.

The charge pump circuit 210 comprises a NAND gate 211 receiving the write enable signal $\overline{WE}$, the clock signal $\phi B$ and a back-bias control signal $\phi A$, a first charge pump capacitor 213 connected between the output terminal 190 of the NAND gate 211 and a first clamping node 191, an inverter 212, a second charge pump capacitor 214 which are connected in series between the terminal 190 and a second clamping node 192, first and second clamping transistors 215 and 216 connected between clamping nodes 191 and 192 and the ground, and transistors 217 and 218 respectively connected between the clamping nodes 191 and 192 and an output node 193.

The back-bias discharge circuit 230 comprises a p-channel MOS transistor 232 whose source and substrate area all connected to the power supply voltage Vcc and whose drain is connected to a node 235, a n-channel MOS transistors 233 whose drain is connected to the node 235 and whose source and substrate are all connected to the output node 193, and a n-channel MOS transistors 231 whose gate is connected to the node 235 and whose substrate and drain-source path are respectively connected to the drain and between the output node 193 and the ground. The write enable signal $\overline{WE}$ is applied to gates of the transistors 232 and 233. The back-bias control circuit 230 comprises n-channel MOS transistors 224 and 225 whose drain-source paths are connected in series between the output node 193 and the node 226 and whose substrates are connected to the output node 193, a p-channel MOS transistors 223 whose source-drain path is connected between the power supply voltage Vcc and the node 226 and whose gate and substrate are respectively connected the ground and the power supply voltage Vcc, an inverter connected between the nodes 226 and 227, and an inverter 222 connected between the node 227 and a feedback line 228. The gate of the transistor 224 is connected to the ground.

Figure 8:
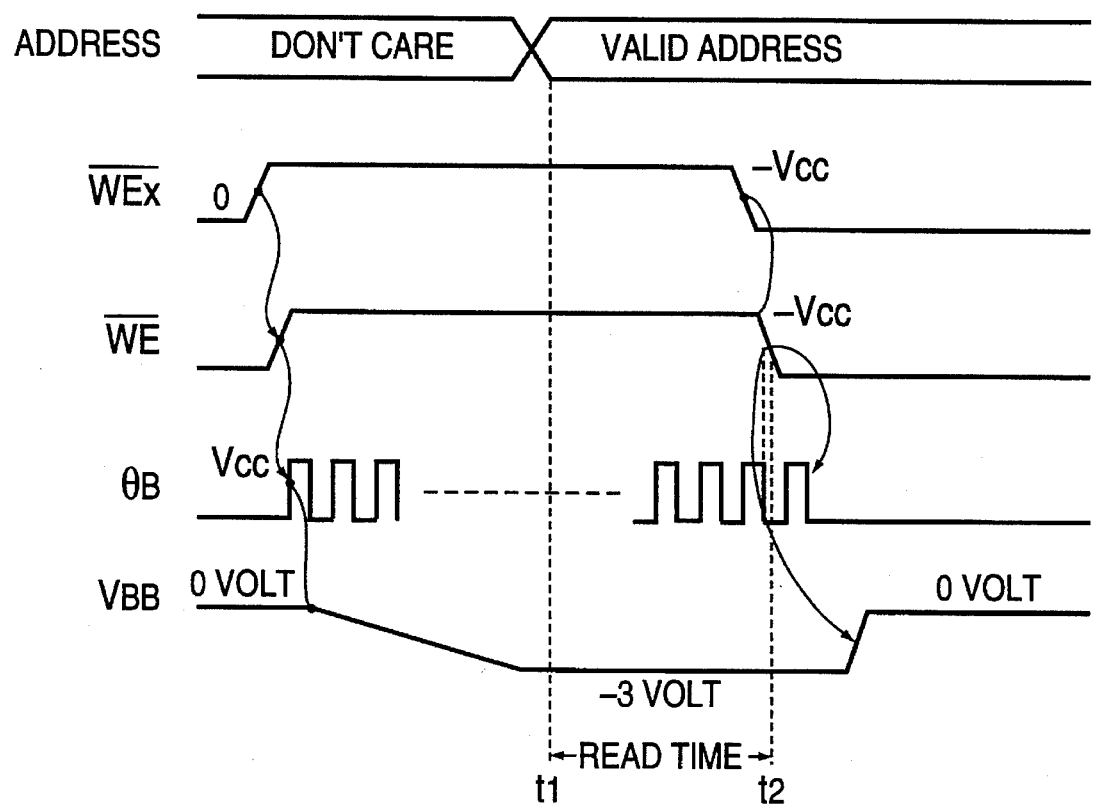
FIG. 8 is a timing diagram for showing the operation of the back-bias generator in FIG. 7.

The operation of the back-bias generator 200 will be explained in reference with a timing diagram showing in FIG. 8. When the external write enable signal $\overline{WEx}$ goes to a high level, the chip internal write enable signal $\overline{WE}$ also goes to a high level (Vcc) via buffer. When the signal $\overline{WE}$ is at a low level (ground), the back-bias discharge circuit 230 renders the back-bias voltage VBB to ground with the conduction of the transistor 231. At this time, the back-bias control circuit 222 outputs a signal of high level to the feedback line 228 with the conduction of the transistors 223 (QA="1"). When the write enable signal $\overline{WE}$ goes to a high level, the NAND gate 211 provides complement of the clock signal $\phi B$ to the output node 190. When the clock signal of the node 190 becomes Vcc, the clamping node 191 is clamped to the threshold voltage of the transistors 215 by the charging of the charge pump capacitor 213. After that, when the signal of the node 190 goes to zero volt, the clamping node 192 becomes the threshold voltage Vth of the transistor 216, while the clamping node 191 becomes to a voltage of (−Vcc+Vth). After that, when the signal of the node 190 goes to Vcc, the node 192 becomes to a voltage of (−Vcc+Vth). Therefore, the transistors 217 and 218 conduct and the output node 193 takes a negative voltage. Finally, the output node 193 becomes a back-bias voltage VBB (=−3 volts) with the repetition of the pulse of the signal $\phi B$. If the back-bias voltage VBB goes below −3 volts, the signal $\phi A$ on the feedback line 228 becomes a low level with the conduction of transistors 224 and 225, thereby not activating the charge pump circuit 210. Therefore, a read operation may be performed from time t1 when the back-bias voltage VBB is stabilized into −3 volts. At time t2, the write enable signal $\overline{WE}$ goes to a low level and the read operation is over.

In reference with FIG. 6, explanation will be made about a read operation of memory cell DT111 in the memory string MS11. During a read operation, the precharge signal PCH and the erase signal ERA are all at low level. Word line WL11 and column selection address Y1 selected by input address signals respectively become a low level and a high level. At the same time, the power supply voltage Vcc of 5 volts is supplied to the string selection line SSL1, unselected word lines WL12 to WL1n and ground selection line GSL1, and the sense amplifier 80 is then activated. Therefore, the sense amplifier 80 may amplify data by sensing current flowing on the bit line BL1 via the transistor MY1 according to the state of program or erase of the selected cell DT111.

In connection with FIG. 6, an erase operation will be explained. The erase of all memory cells is normally performed prior to the program. Such erase operation may be performed by a sequential erase per each word line. Of course, all memory cells connected with the word line chosen by user may be erased too.

Figure 9:
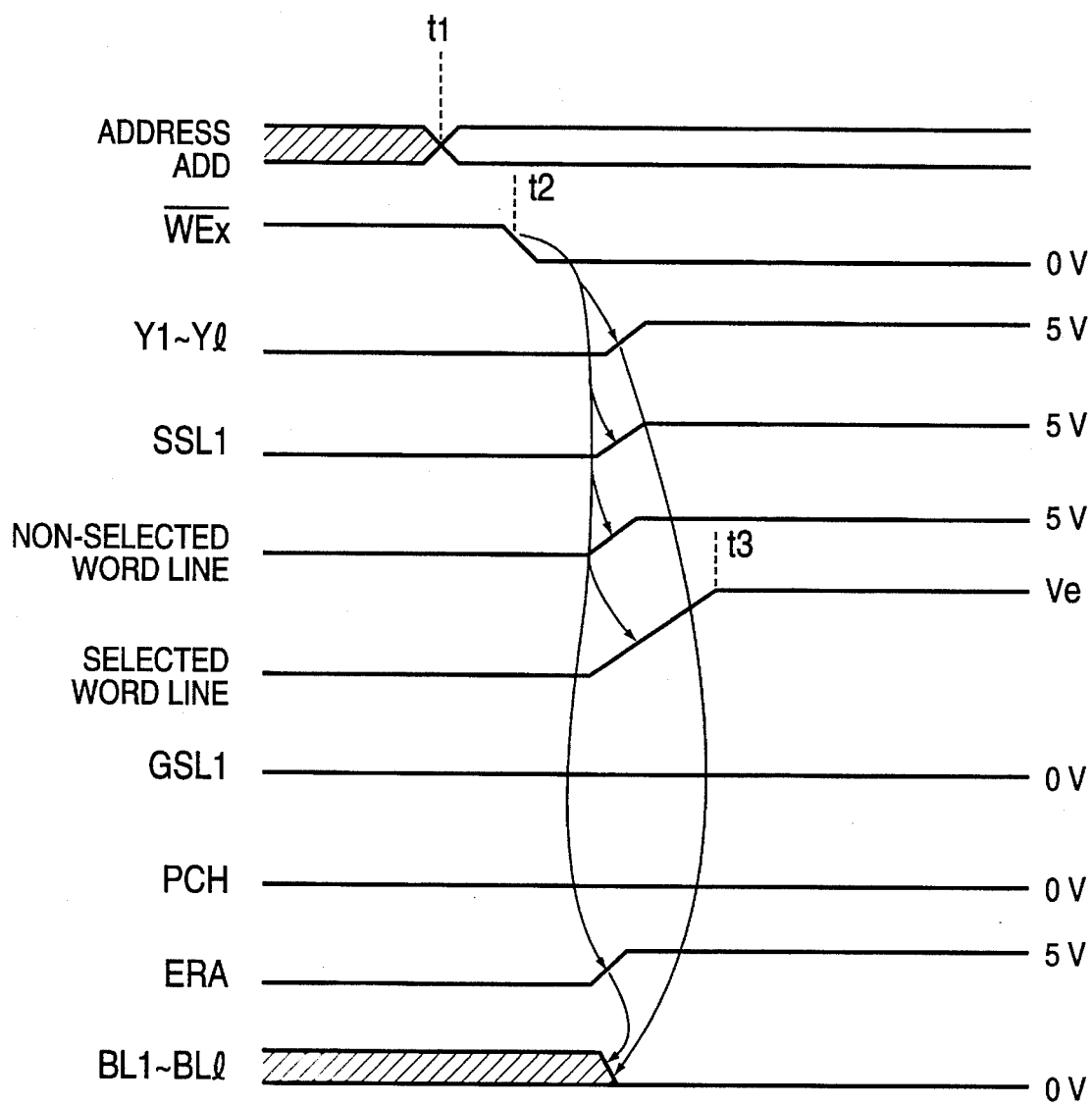
FIG. 9 is a timing diagram for showing the erasing operation of the circuit in FIG. 6 according to the present invention.

Referring to timing diagrams of erase shown in FIG. 9 explanation will be made about an erase operation of memory cells on the word line WL113. At time t1, external input address signals ADD are received. At time t2, when external write enable signal $\overline{WEx}$ goes from a high level to a low level, column address signals Y1 to Yl goes to high level, and then the string selection line SSL1, the unselected word lines WL11, WL12 and WL14 to WL1n, and the erase signal ERA, all, go to high level. At the same time, the selected word line WL13 receives the erase voltage Ve. During the erase operation, the precharge signal PCH and the ground selection line GSL1 keep ground potential. Therefore, transistors 37 and MY1 to MYl are all turned ON in response to the erase signal ERA and column selection address signals Y1 to Yl, and then bit lines BL1 to BLl are all at the ground potential. Also, all drains of the selected memory cells DT131 to DT13l are grounded by the conduction of string selection transistors ST11 to ST1l and memory cells DT111 to DT11l and DT121 to DT12l, and the erase voltage Ve is applied to control gates of the selected memory cells DT131 to DT13l, at time t3. After time t3, thereby all memory cells connected to the word line WL13 become enhancement transistors. That is to say, said cells are all erased in normally OFF states.

Figure 10:
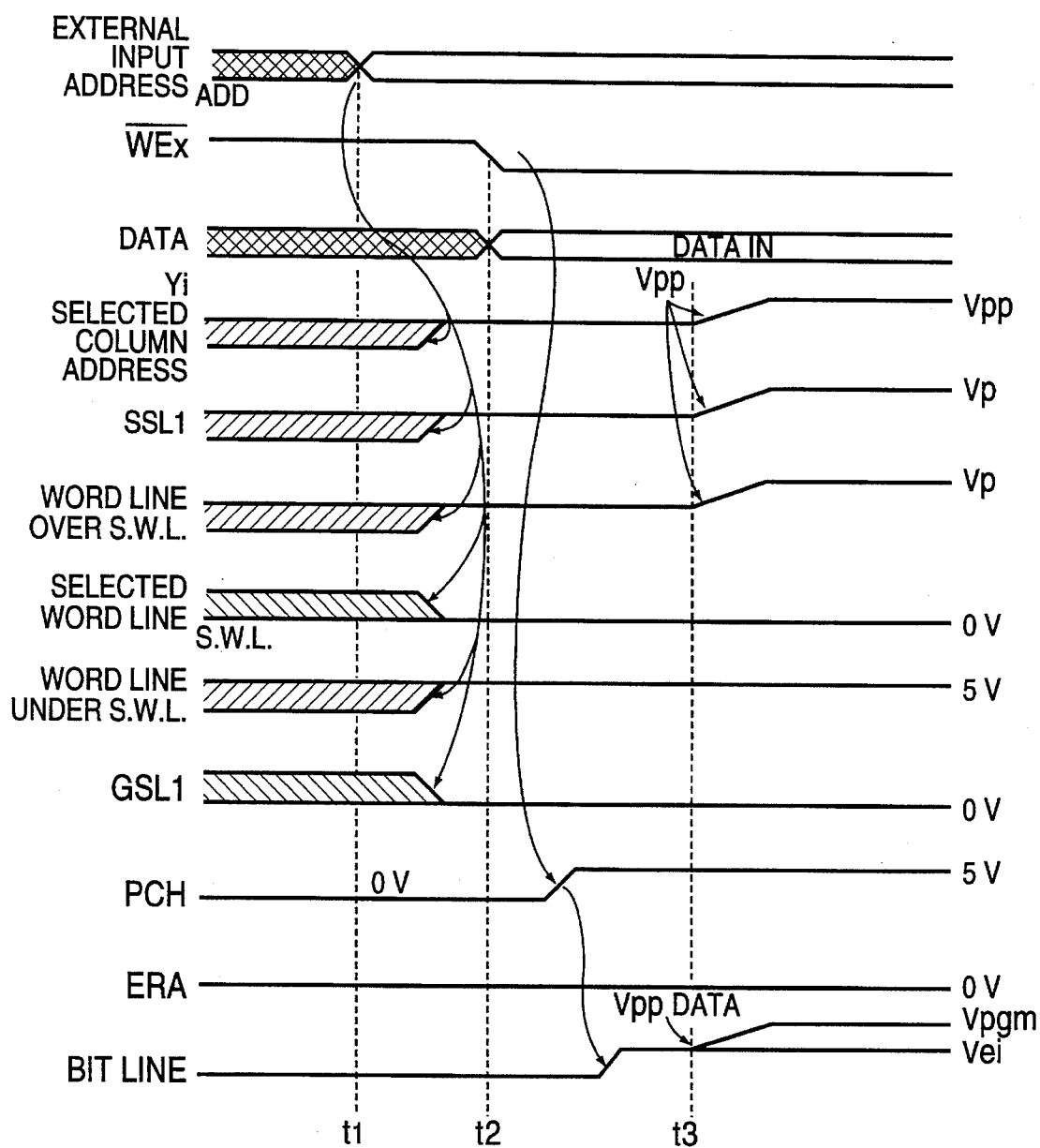
FIG. 10 is a timing diagram for showing the programming operation of the circuit in FIG. 6 according to the present invention.

Referring to timing diagrams of FIG. 10, explanation will be made about programming the memory cell DT113 in memory string MS11. At time t1, external address signals ADD selecting the memory cell DT113 are received. Column address signal Y1 selected by the address signals goes to a high level and the power supply voltage Vcc of 5 volts is applied to the string selection line SSL1 and unselected word lines WL11, WL12 and WL14 to WL1n. At the same time, the selected word line WL13 and the ground selection line GL1 are grounded and the erase signal ERA keeps a low level (ground). At time t2, the external write enable signal $\overline{WEx}$ goes from a high level to a low level and data are received in. The precharge signal PCH goes to a high level by the signal $\overline{WEx}$ and bit lines BL1 to BLl are precharged to the erase preventing voltage Vei by the conduction of transistors MP1 to MPl. At this time, only the bit line BL1 selected by the selected column address signal Y1 is coupled to the program control circuit 90 via the data line 57. The sense amplifier remains at a floating state. At time t3, when the high voltage Vpp is supplied, the selected column address signal Y1 goes to the high voltage Vpp and the pass voltage Vp is applied to the string selection line SSL1 and unselected word lines WL11 and WL12 on the selected word line WL13. In the program control circuit 90, when data $\overline{DATA}$ is a low level, the transistor 91 and the transistor 92 are respectively turned OFF and ON. However, the transistor 91 and the transistor 92 are respectively turned ON and OFF, when data DATA is a high level. Therefore, since the external data DATA (complement of $\overline{DATA}$) inputs a low level (binary "0") in order to program the memory cell DT113 into a binary data "0", the program voltage Vpgm is applied to the bit line BL1 via the data line 57 and the transistor MY1 by the conduction of transistor 91, thereby programming the memory cell DT113. On the contrary, the external data DATA inputs a high level to cause the memory cell DT113 to program into an erase state, and then the erase preventing voltage Vei is supplied to the bit line BL1.

Figure 11:
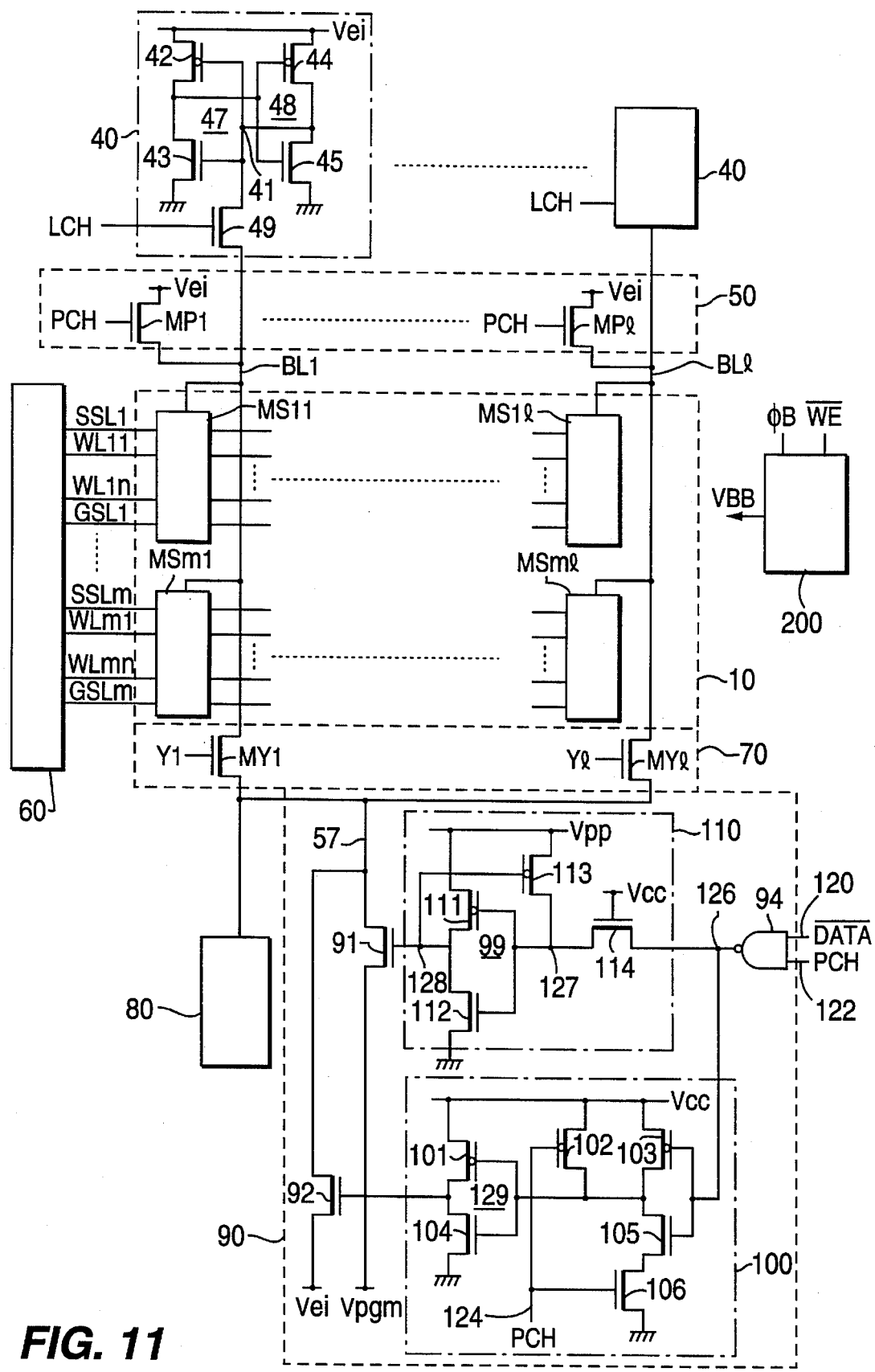
FIG. 11 is a schematic circuit diagram of another embodiment according to the present invention.

FIG. 11 is a circuit diagram of another embodiment of the present invention for preventing the over-erase made by the repetition of erasing and programming. It should been noted that, in FIG. 11, the same parts or elements as those in FIG. 6 are represented in the same simbols or reference numerals. As compared with FIG. 6, the circuitry of FIG. 11 does not have the bit line grounding circuit 35, while it has a latch circuit 40 connected to the respective bit lines BL1 to BLl. The latch circuit 40 is connected to the respective bit lines BL1 to BLl for maintaining the respective bit lines to a predetermined voltage according to an erase state of the respective memory cells connected to the selected word line in the operation of sensing states of cells which is performed prior to an erase operation. The latch circuit 40 comprises an n-channel MOS transistor 49 whose drain-source path is connected between each of bit lines and node 41, an inverter 47 whose input terminal is connected to the node 41, and an inverter 48 whose input terminal and output terminal are respectively connected to the output terminal of the inverter 47 and the node 41. The inverter 47 comprises a p-channel MOS transistor 42 and an n-channel MOS transistor 43, and the inverter 48 comprises a p-channel MOS transistor 44 and an n-channel MOS transistor 45.

Figure 12:
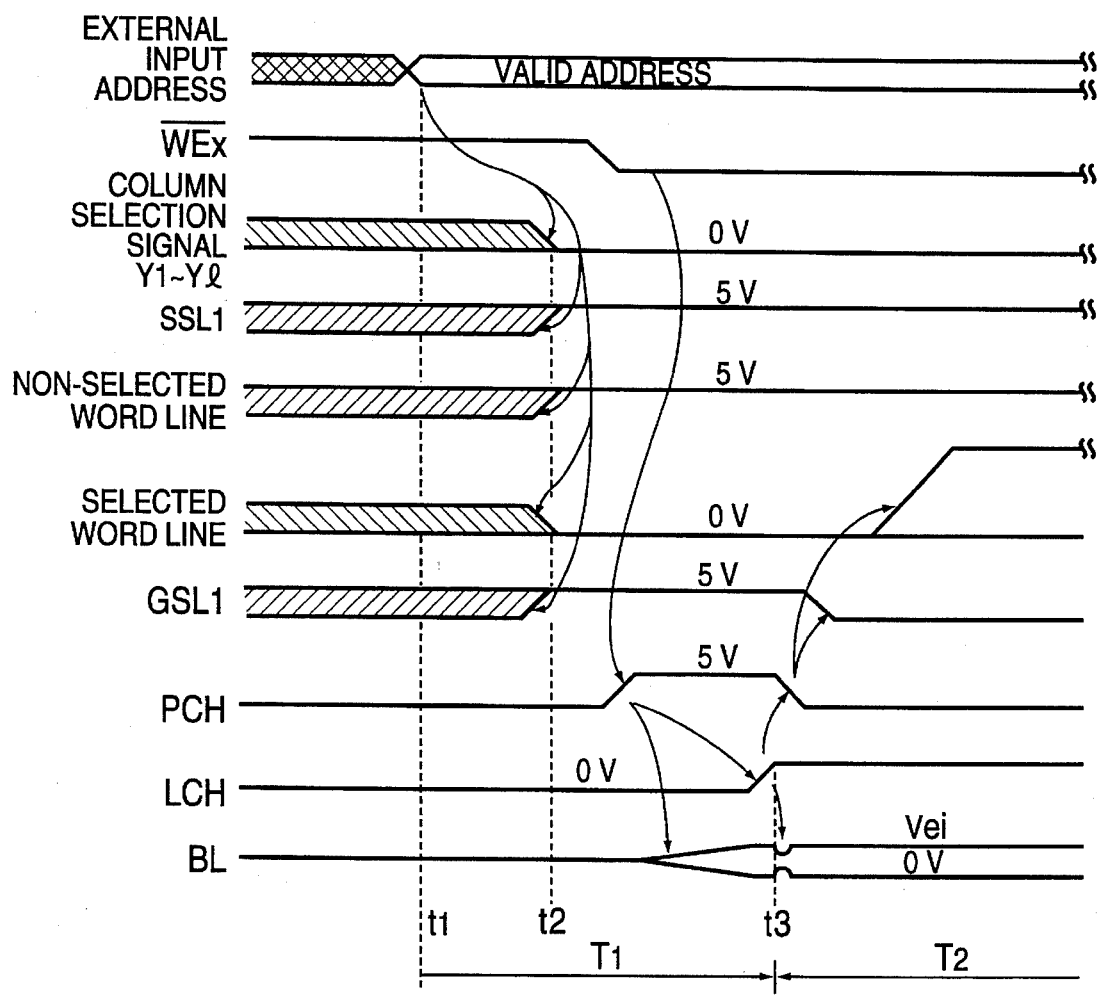
FIG. 12 is a timing diagram for showing the erasing operation of the circuit in FIG. 11.

In reference to timing diagrams of FIG. 12, an erase operation of the device of FIG. 11 will be explained. Erase of memory cells on the selected word line in the memory cell array 10 is performed by two steps on a cell state sensing period T1 and an erase period T2. The cell state sensing is performed in a short periode (t1 to t3) of about 100-nsec. For the convenience of explanation, assuming that memory cells DT112 to DTl12 on the word line WL12 is erased, the memory cell DT112 on the word line WL12 in the memory string MS11 was at a state programmed into a depletion MOS transistor ("0" state), and memory cells DT122 to DT1l2 in remaining memory strings MS12 to MS1l were all at states erased into enhancement MOS transistors ("1" states).

At time t1, external input address signal are received for selecting cells on the word line WL12. At time t2, the power supply voltage Vcc is thereby applied to the string selection line SSL1, all unselected word lines WL11 and WL13 to WLn, and the ground selection line GSL1. At the same time, the selected word line WL12 and the column selection signals Y1 to Yl go to the ground potential. After that, when the external write enable signal $\overline{WEx}$ changes from a high level (5 volts) to a low level (0 volt), the cell state sensing operation, which is to read the selected cell by change of the precharge signal PCH from a low level to a high level for conducting transistors MP1 to MPl, is substantially started. Therefore, since the memory string MS11 becomes ON state and the remaining memory strings MS12 to MS1l becomes OFF states, the bit line BL1 goes near to the ground potential and bit lines BL1 to BLl are charged to the erase preventing voltage Vei. At time t3, the latch signal LCH goes to a high level and transistors 49 are turned ON. Also, the signal PCH goes to a low state, the ground selection line GL1 goes to the ground and the selected word line WL12 goes to the erase voltage Ve. Therefore, the bit line BL1 becomes the ground and the bit lines BL2 to BLl keep the erase preventing voltage Vei by means of the latch circuit 40. After completion of the cell state sensing operation, erase of the cell DT112 in the memory string MS11 begins by rise of the selected word line WL12 to the erase voltage Ve. The period for erasing the cell is about 100 msec. However, since the erase preventing voltage Vei is transferred to drains of the memory cells DT122 to DT1l2, each of these cells is prevented from injection of electrons to the floating gate thereof with the aid of electric field reduction between its floating gate and its channel, thereby being capable of achieving the prevention of over-program given by the high erase voltage Ve.

Program and read operations of the EEPROM device in FIG. 11 are substantially like to those of the device in FIG. 6 because the erase signal ERA and the latch signal LCH become low level during these operations.

Figure 13:
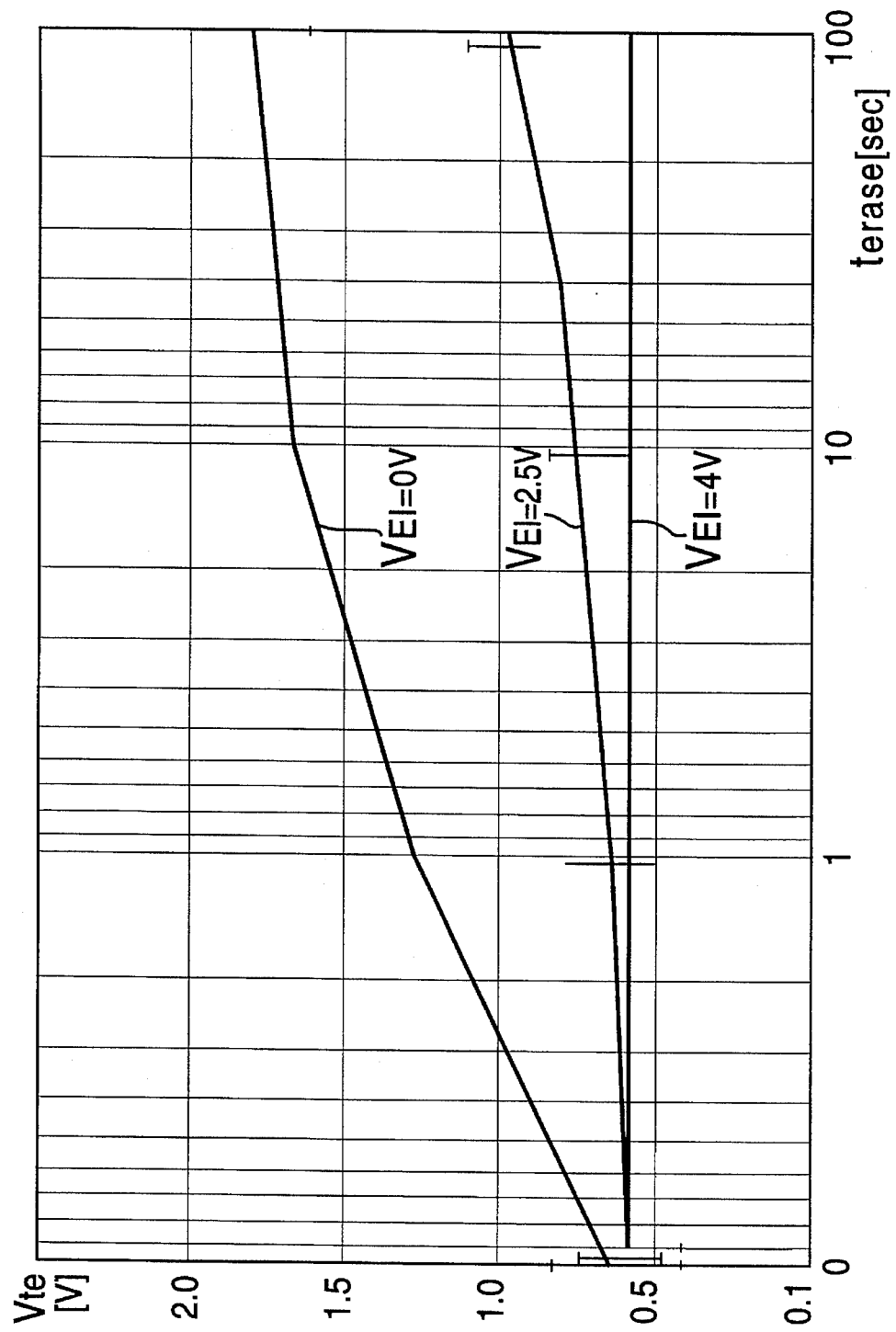
FIG. 13 is a graph for showing the result of preventing from over-erase according to the present invention.

FIG. 13 shows, wherein an erase operation of an erased cell for 100-seconds in the memory cell array of the present invention is performed, the variation of the threshold voltage Vte of the erased cell according to various precharge voltage applied to the corresponding bit line. As can be seen in FIG. 13, it can be understood that erase endurance may be sufficiently achieved by the erase preventing voltage of 4 volts applied to the bit line.

As mentioned above, the device of the present invention has advantages that the program voltage may be lowered by employing memory cells of depletion-type floating gate transistors and the disturbance between cells may be prevented owing to establishment of the pass voltage less than the program voltage. Moreover, upon programming operation, the disturbance due to the over-program may be prevented by application of predetermined voltage to unselected word lines beneath selected word lines. Furthermore, the over-erase of erased cells may be prevented by sensing the erased cells during a page erase operation.

While the invention has been particularly shown and described with reference to a preferred embodiment, it will be understood by those skilled in the art that modifications in detail may be made without departing from the spirit and scope of the invention.

What is claimed is:

1. An electrically erasable programmable semiconductor memory device, comprising:
   a plurality of bit lines arranged in columns;
   a data line;
   a plurality of string selection lines arranged in rows;
   a plurality of ground selection lines arranged in rows;
   a plurality of word lines arranged in rows;
   a plurality of memory strings arranged in columns, each of said memory string having a string selecting transistor, a plurality of floating-gate transistors and a ground selection transistor with respective drain-source paths coupled in series;
   a memory cell array wherein a drain of the string selection transistor and a source of the ground selection transistor in each memory string of the same column, are each coupled with the bit line and the ground of a corresponding column, and wherein a gate of the string selection transistor, each control gate of the floating-gate transistors and a gate of the ground selection transistor in each memory string of a same row, are respectively coupled with a string selection line, word lines and a ground selection line;

row selection means coupled to the string selection line, the word lines and the ground selection line from memory strings for each row, for applying a given voltage according to either one of erase, program and read operations to selected word lines and unselected word lines, and the string and ground selection lines extending from the memory strings in a single row specific according to an input row address;

precharge means coupled with each bit line, for precharging unselected bit lines with an erase prevention voltage during the program operation;

column selection means coupled between the bit lines and the data line, for electrically connecting a selected bit line to said data line according to an input column address during the program and read operations and connecting all the bit lines to said data line during the erase operation;

ground selection means coupled to said data line, for grounding all the bit lines during the erase operation; and program control means coupled to said data line, for providing said selected bit line with one of a program voltage and an erase prevention voltage in response to input data during the program operation, said program control means comprising:

a logic gate for providing first and second logic signals in response to the input data and a precharge signal;

a first transistor having a drain-source path connected between said data line and a program voltage terminal;

a second-transistor having a drain-source path connected between said data line and an erase prevention voltage terminal;

high-voltage switching means coupled between said logic gate and a gate of the first transistor, for enabling conduction of said first transistor in response to said first logic signal; and an AND gate coupled between said logic gate and a gate of the second transistor, for enabling conduction of said second transistor in response to said second logic signal and said precharge signal.

2. An electrically erasable programmable semiconductor memory device, comprising:

a plurality of bit lines arranged in columns;

a plurality of memory strings arranged in columns, each memory string having a string selecting transistor, a plurality of floating-gate transistors and a ground selection transistor with respective drain-source paths coupled in series;

a memory cell array wherein a drain of the string selection transistor and a source of the ground selection transistor in each memory string of the same column, are each coupled with the bit line and the ground of a corresponding column, and wherein a gate of the string selection transistor, each control gate of the floating-gate transistors and a gate of the ground selection transistor in each memory string of the same row, are respectively coupled with a string selection line, word lines and a ground selection line;

row selection means coupled to the string selection line, the word lines and the ground selection line from memory strings of each row, for applying a ground voltage to a selected word line coupled to the memory strings in a row according to an input row address during a program operation, and for applying a pass voltage to unselected word lines between said selected word line and a string selection line of the particular memory string, and to said string selection line;

column selection means coupled between each bit line and a data line, for electrically connecting said selected bit line to said data line according to an input column address during a program operation;

precharge means coupled with each bit line, for precharging each bit line with an erase prevention voltage in response to a precharge signal during the program operation; and program control means coupled to said data line, for providing said selected bit line with one of a program voltage and an erase prevention voltage in response to input data, upon the program operation, wherein during the program operation, a given voltage is applied to the unselected word lines between said selected word line and the ground selection line of the particular memory strings, and the ground voltage is applied to said ground selection line, and wherein said program control means comprises:

a gate for providing first and second logic signals in response to the input data and said precharge signal;

a first transistor having drain-source path connected between said data line and a program voltage terminal;

a second transistor having drain-source path connected between said data line and an erase prevention voltage terminal;

high-voltage switching means coupled between said gate and a gate of the first transistor, for enabling conduction of said first transistor in response to said first logic signal; and an AND gate coupled between said gate and a gate of the second transistor, for enabling conduction of said second transistor in response to said second logic signal and said precharge signal.

3. An electrically erasable programmable semiconductor memory device as claimed in claim 2, wherein said each floating-gate transistor in the memory cell array is an N-channel MOS transistor having a virgin threshold voltage of about −1 volt to −5 volts.

4. An electrically erasable programmable semiconductor memory device as claimed in claim 3, wherein said pass voltage is about 13 volts, said program voltage is about 18 volts and said erase prevention voltage is about 4 volts.

5. An electrically erasable programmable semiconductor memory device, comprising:

a plurality of bit lines arranged in columns;

a plurality of memory strings arranged in columns and connected to said plurality of bit lines respectively, each memory string having a string selection transistor, a plurality of floating-gate depletion-type transistors representing memory cells, and a ground selection transistor with respective drain-source paths coupled in series, each of said floating-gate depletion-type transistors exhibiting a negative virgin threshold voltage and being formed by a P-type well region formed on a N-type substrate comprising a source region and a drain region separated and spaced-apart by a channel region implanted by N-type impurities;

a string selection line connected to the string selection transistor of each memory string;

a plurality of word lines connected to said plurality of floating-gate depletion-type transistors of each memory string, respectively;

a ground selection line connected to the ground selection transistor of each memory string;

row selection means coupled to the string selection line, the word lines and the ground selection line from the memory strings of each row, for applying a given voltage according to one of erase, program and read operations to selected word lines and unselected word lines, the string and ground selection lines in a single row of the memory strings according to an input address;

precharge means coupled with said each bit line, for precharging unselected bit lines with an erase prevention voltage during the program operation; and back-bias generator means for generating a back-bias voltage to said P-type well region of the memory cells during the read operation, said back-bias generator means comprising:

charge pump means for generating said back-bias voltage during the read operation;

back-bias control means for controlling said back-bias voltage at a constant level; and back-bias discharge means for inhibiting generation of said back-bias voltage during the erase and program operations.

6. In an electrically erasable programmable semiconductor memory device having a memory cell array including a plurality of bit lines in columns and a plurality of memory strings arranged in columns and connected to said bit lines respectively, each of said memory strings comprising a plurality of the memory cells connected to a corresponding bit line, each memory cell being a depletion-type N-MOS transistor exhibiting a negative virgin threshold voltage, said memory cell comprising:

a substrate of a first conductivity type;

a well region of a second conductivity type formed on said substrate, said well region accommodating application of a back-bias voltage to prevent leakage current flowing via a channel region of said memory cell during a data read operation;

drain and source regions formed on said well region, said drain and source regions being separated and spaced-apart from each other by said channel region exhibiting impurities of said first conductivity type from one of arsenic and phosphorous to minimize inter-memory cell disturbance;

a first insulation layer formed on said channel region and an edge portion of the drain region;

a floating gate region formed on said first insulation layer and extended to overlap said edge portion of said drain region;

a second insulation layer formed on said floating gate; and a control gate region formed on said second insulation layer.

7. The memory cell as claimed in claim 6, wherein said first and second insulation layers are oxide layers having thicknesses of approximately 100Å and 280Å, respectively.

8. The memory cell as claimed claim 6, further comprised of said floating gate region and said control gate region comprising polycrystalline silicon layers.

9. The memory cell as claimed in claim 8, wherein said negative virgin threshold voltage is about −1 to −5 volts.

10. An electrically erasable programmable semiconductor memory device, comprising;

a plurality of bit lines arranged in columns;

a plurality of memory strings arranged in columns and connected to said plurality of bit lines respectively, each memory string having a string selection transistor, a plurality of floating-gate depletion-type transistors representing memory cells, and a ground selection transistors with respective drain-source paths coupled in series, each of said floating-gate depletion-type transistors exhibiting a negative virgin threshold voltage and being formed by a P-type well region on a N-type substrate comprising a source region and a drain region separated and spaced-apart by a channel region implanted by N-type impurities;

a string selection line connected to the string selection transistor of each memory string;

a plurality of word lines arranged in rows and connected to said plurality of floating-gate depletion-type transistors of each memory string, respectively;

a ground selection line connected to the ground selection transistor of each memory string; and row selection means coupled to the string selection line, the word lines and the ground selection line from the memory strings of each row, for applying a given voltage according to one or erase, program and read operations to selected word lines and unselected word lines, the string and ground selection lines in a single row of the memory strings according to an input address;

precharge means coupled with each bit line, for precharging unselected bit lines with an erase prevention voltage during the program operation to prevent over-erase of memory cells; and back-bias generator means for supplying a back-bias voltage to said P-type well region of memory cells during the read operation to prevent leakage current.

11. An electrically erasable programmable semiconductor memory device as claimed in claim 10, further comprising:

column decoder means coupled between said plurality of bit lines and a data line, for electrically connecting a selected bit line to said data line during the program and read operations, and electrically connecting all the bit lines to said data line during the erase operation;

ground selection means coupled to said data line, for grounding all the bit lines during the erase operation;

sense amplifier means coupled to said data line, for generating a read voltage during the read operation; and program control means coupled to said data line, for electrically connecting said selected bit line to said data line and providing said selected bit line with one of a program voltage and said erase prevention voltage during the program operation.

12. An electrically erasable programmable semiconductor memory device as claimed in claim 11, wherein said program control means comprises:

a first logic gate for providing first and second logic signals in response to input data and a precharge signal;

a first transistor having a first electrically conduction electrode connected to said data line and a second electrically conduction electrode coupled to receive said program voltage;

a second transistor having a first electrically conduction electrode connected to said data line and a second electrically conduction electrode coupled to receive said erase prevention voltage;

high-voltage switch means connected to a control electrode of said first transistor, for enabling conduction of said first transistor in response to said first logic signal; and erase-voltage switch means connected to a control electrode of said second transistor, for enabling conduction of said second transistor in response to said second logic signal and said precharge signal.

13. An electrically erasable programmable semiconductor memory device as claimed in claim 10, further comprised of each floating-gate depletion type transistor exhibiting said negative virgin threshold voltage of about −1 volt to −5 volts.

14. An electrically erasable programmable semiconductor memory device as claimed in claim 12, wherein said row selection means controls the erase operation of all memory cells by:

grounding all the bit lines and the ground selection line;

applying a power voltage to the string selection line; and applying said erase voltage to all the word lines.

15. An electrically erasable programmable semiconductor memory device as claimed in claim 14, wherein said row selection means controls the erase operation of a single row of memory cells by:

applying said erase voltage to the selected word line;

grounding all the bit lines; and applying a power voltage to the unselected word lines on the memory string.

16. An electrically erasable programmable semiconductor memory device as claimed in claim 15, wherein said row selection means controls the program operation of the memory string by:

grounding the selected word line and the ground selection line;

applying said power voltage to the unselected word lines between the selected word line and the ground selection line to prevent over-programming of memory cells;

applying a pass voltage to the unselected word lines between the selected word line and the string selection line;

applying said program voltage to the selected word line; and applying said erase prevention voltage to the unselected bit lines to prevent over-erasure of said memory cells.

17. An electrically erasable programmable semiconductor memory device as claimed in claim 16, wherein said program control means, said sense amplifier means and said back-bias generator means concomitantly control the read operation by:

applying said power voltage to the string selection lines, the unselected word lines and the ground selection line;

grounding the selected word line;

applying aid read voltage to the selected bit line; and applying said back-bias voltage to said P-type well region of said memory cells to prevent leakage current.

18. An electrically erasable programmable semiconductor memory device as claimed in claim 10, wherein said back-bias generator means comprises:

charge pump means for generating said back-bias voltage during the read operation;

back-bias control means for controlling said back-bias voltage at a constant level; and back-bias discharge means for inhibiting generation of said back-bias voltage during the erase and program operations.

19. An electrically erasable programmable semiconductor memory device as claimed in claim 11, wherein said erase voltage is about 18 volts, said program voltage is about 13 volts, said power voltage is about 5 volts, said pass voltage is about 15 volts, said read voltage is about 2 volts, said erase prevention voltage is about 0–4 volts, and said back-bias voltage is about −3 volts.

20. An electrically erasable programmable semiconductor memory device, comprising:

a plurality of bit lines arranged in columns;

a plurality of word lines arranged in rows;

a plurality of memory strings arranged in columns and connected to said plurality of bit lines respectively, each memory string comprising a string selection transistor, a plurality of floating-gate transistors connected to said plurality of word lines, and a ground selection transistor with respective drain-source paths coupled in series forming a memory cell array, wherein each floating gate transistor is a N-channel MOS memory cell comprising a N-type semiconductor substrate, a P-type well region formed on said N-type semiconductor substrate, a channel region implanted with N-type impurities, positioned between a source region and a drain region and formed on said P-type well region;

a data line;

column decoder means coupled to said data line and said bit lines, for selecting one of the memory strings arranged in columns in accordance with an input column address;

precharge means coupled with said bit lines, for precharging unselected bit lines with an erase prevention voltage during a program operation to prevent over-erasure of memory cells;

program control means coupled to said data line, for providing a program voltage to said data line during said program operation;

latch means coupled with said bit lines, for latching said bit lines connected to selected word lines to a given voltage prior to an erase operation; and back-bias generator means for applying a back-bias voltage to said P-type well region of selected memory cells during a read operation to prevent leakage current; and row selection means coupled to the string selection line, the word lines and the ground selection line from each memory string of each row, for selecting ones of the word lines in a memory string in accordance with an input row address and enabling execution of said erase operation, said program operation and said read operation.

21. An electrically erasable programmable semiconductor memory device as claimed in claim 20, wherein said back-bias generator means comprises:

charge pump means for generating said back-bias voltage during the read operation;

back-bias control means for controlling said back-bias voltage at a constant level; and back-bias discharge means for inhibiting generation of said back-bias voltage during the erase and program operations.

22. An electrically erasable programmable semiconductor memory device as claimed in claim 20, wherein each N-channel MOS memory cell in said memory cell array exhibits a virgin threshold voltage of about −1 volt to −5 volts.

23. An electrically erasable programmable semiconductor memory device as claimed in claim 20, wherein said erase operation of all memory cells is executed by:

grounding all the bit lines and the ground selection line;

applying a power voltage to the string selection line; and applying said erase voltage to all the word lines.

24. An electrically erasable programmable semiconductor memory device as claimed in claim 20, wherein said erase operation of a single row of memory cells is executed by:

applying said erase voltage to the selected word line;

grounding all the bit lines; and applying a power voltage to the unselected word lines on the memory string.

25. An electrically erasable programmable semiconductor memory device as claimed in claim 20, wherein said program operation of the memory string is executed by:

grounding the selected word line and the ground selection line;

applying said power voltage to the unselected word lines between the selected word line and the ground selection line to prevent over-programming of memory cells;

applying a pass voltage to the unselected word lines between the selected word line and the string selection line;

applying said program voltage to the selected word line; and applying said erase prevention voltage to the unselected bit lines to prevent over-erasure of memory cells.

26. An electrically erasable programmable semiconductor memory device as claimed in claim 20, wherein said read operation is executed by:

applying said power voltage to the string selection lines, the unselected word lines and the ground selection line;

grounding the selected word line;

applying said read voltage to the selected bit line; and applying said back-bias voltage to said P-type well region of said selected memory cells to prevent leakage current.

27. An electrically erasable programmable semiconductor memory device, comprising: p1 a plurality of bit lines arranged in columns;

a plurality of word lines arranged in rows;

a plurality of memory strings arranged in columns, each memory string comprising a string selecting transistor connected to respective bit line, a plurality of floating-gate transistors and a ground selection transistor with respective drain-source paths coupled in series forming a memory cell array, each floating-gate transistor representing a N-channel MOS memory cell comprising a control gate connected to respective word line, a P-type well region formed on a N-type semiconductor substrate, a channel region implanted with N-type impurities, positioned between a source region and a drain region and formed on said P-type well region;

row selection means coupled to the string selection line, the word lines and the ground selection line from the memory strings connected to each row, for making selection of word lines in rows according to an input row address;

column selection means coupled to said bit lines and a data line, for making selection of bit lines in columns according to an input column address;

precharge means coupled to said bit lines, for precharging unselected bit lines with an erase prevention voltage during said program operation;

program control means coupled to said data line, for providing said selected bit line with one of a program voltage and said erase prevention voltage during said program operation; and back-bias generator means for applying a back-bias voltage to said P-type well region of selected memory cells during a read operation to prevent leakage current.

28. An electrically erasable programmable semiconductor memory device as claimed in claim 27, wherein said program control means comprises:

a logic gate for providing first and second logic signals in response to the input data and a precharge signal;

a first transistor having a first electrode of a principle electrically conducting channel coupled to said data line and a second electrode of said principle electrically conducting channel coupled to receive said program voltage;

a second transistor having a first electrode of a principle electrically conducting channel coupled to said data line and a second electrode of said principle electrically conducting channel coupled to receive said erase prevention voltage;

high-voltage switch means connected to a control electrode of said first transistor, for enabling conduction of said first transistor in response to said first logic signal; and erase-voltage switch means connected to a control electrode of said second transistor, for enabling conduction of said second transistor in response to said second logic signal and said precharge signal.

29. An electrically erasable programmable semiconductor memory device as claimed in claim 27, wherein each memory cell exhibits a virgin threshold voltage of about −1 volt to −5 volts.

30. An electrically erasable programmable semiconductor memory device as claimed in claim 27, further comprising:

ground selection means coupled to said data line, for grounding all the bit lines during an erase operation; and sense amplifier means coupled to said data line, for sensing data of selected memory cells during said read operation.

31. A semiconductor memory device, comprising:

a plurality of bit lines arranged in columns;

a plurality of word lines arranged in rows;

a plurality of memory strings arranged in columns each comprising a string selecting transistor, a plurality of floating-gate transistors and a ground selection transistor with respective drain-source paths coupled in series forming a memory cell array, each floating-gate transistor representing a N-channel MOS memory cell exhibiting a negative threshold voltage and comprising a control gate connected to respective word line and positioned on a P-type well region formed on a N-type semiconductor substrate, a channel region implanted with N-type impurities, positioned between a source region and a drain region and formed on said P-type well region, wherein said P-type well region accommodates application of a back-bias voltage to prevent leakage current flowing via said channel region during reading of selected memory cells;

means for making selection of word lines in rows and for making selection of bit lines in columns according to input addresses;

operation means for erasing all memory cells coupled a selected word line in a single row by applying an erase voltage to said selected word line, grounding all the bit lines, and applying a power voltage to the unselected word lines of respective memory string, and for alternatively erasing all memory cells coupled to all word lines by grounding all the bit lines and the ground selection line, applying said power voltage to the string selection line, and applying said erase voltage to all word lines.

32. The semiconductor memory device as claimed in claim 31, further comprised of said operation means programming a selected memory cell in the memory string by:

grounding said selected word line and said ground selection line in the memory string;

applying a power voltage to unselected word lines between said selected word line and said ground selection line to prevent over-programming of memory cells;

applying a pass voltage to unselected word lines between said selected word line and said string selection line;

applying a program voltage to said selected word line; and applying an erase prevention voltage to unselected bit lines to prevent over-erasure of memory cells.

33. The semiconductor memory device as claimed in claim 32, further comprised of said operation means reading selected memory cells in a memory string by:

applying said power voltage to the string selection line, the unselected word lines and the ground selection line;

grounding the selected word line, and concurrently applying a read voltage to the selected bit line; and applying said back-bias voltage to said P-type well region of said selected memory cells.

* * * * *